US012676293B2

(12) United States Patent
Kaneko et al.

(10) Patent No.: US 12,676,293 B2
(45) Date of Patent: Jul. 7, 2026

(54) PLASMA PROCESSING APPARATUS AND PLASMA CONTROL METHOD

(71) Applicant: Tokyo Electron Limited, Tokyo (JP)

(72) Inventors: Kazushi Kaneko, Yamanashi (JP);
Satoru Kawakami, Yamanashi (JP);
Yuki Osada, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 149 days.

(21) Appl. No.: 18/617,334

(22) Filed: Mar. 26, 2024

(65) Prior Publication Data

US 2024/0339304 A1 Oct. 10, 2024

(30) Foreign Application Priority Data

Apr. 4, 2023 (JP) ................................. 2023-060604

(51) Int. Cl.
*H01J 37/32* (2006.01)

(52) U.S. Cl.
CPC .. *H01J 37/32669* (2013.01); *H01J 37/32165* (2013.01)

(58) Field of Classification Search
None
See application file for complete search history.

(56) References Cited

U.S. PATENT DOCUMENTS 5,024,716 A * 6/1991 Sato .................. H01J 37/32192
204/298.37
5,368,676 A * 11/1994 Nagaseki ............ H01J 37/3233
156/345.46
5,800,688 A * 9/1998 Lantsman ........... H01J 37/3408
204/192.12
6,361,707 B1 * 3/2002 Tanaka .............. H01J 37/32192
438/726
6,808,759 B1 * 10/2004 Okumura .............. C23C 16/505
216/66
7,372,057 B2 * 5/2008 Gaebel ................. H05G 2/0035
250/497.1
7,704,887 B2 * 4/2010 Fu ..................... H01L 21/02068
134/61

(Continued)

FOREIGN PATENT DOCUMENTS

JP 2009-245593 A 10/2009

*Primary Examiner* — Srinivas Sathiraju
(74) *Attorney, Agent, or Firm* — Fenwick & West LLP

(57) ABSTRACT

There is a plasma processing apparatus comprising: a processing chamber having a processing space; an electromagnetic wave generator configured to generate electromagnetic waves for plasma excitation; a dielectric having a first surface; an electromagnetic wave supply part configured to supply the electromagnetic waves to the processing space via the dielectric; and a resonator array structure disposed along the first surface of the dielectric, wherein the resonator array structure includes a plurality of resonators, each resonator having a structure in which a conductive member is laminated on one surface of a dielectric plate, having a first resonance frequency, capable of resonating with magnetic field components of the electromagnetic waves and having a size smaller than a wavelength of the electromagnetic waves, and the resonator array structure is configured to form cells surrounded by the resonators, and the cells include the resonators having different first resonance frequencies between the cells.

18 Claims, 24 Drawing Sheets

(56)      References Cited

U.S. PATENT DOCUMENTS

| | | | | |
|---|---|---|---|---|
| 9,653,264 | B2 * | 5/2017 | Nagorny | H01J 37/32715 |
| 10,522,384 | B2 * | 12/2019 | Vukovic | H01L 21/68714 |
| 11,195,696 | B2 * | 12/2021 | Shin | H01L 21/6831 |
| 2011/0088848 | A1 | 4/2011 | Kim et al. | |
| 2012/0247678 | A1 * | 10/2012 | Takahashi | H01L 21/6831 |
| | | | | 156/345.44 |
| 2013/0134528 | A1 * | 5/2013 | Nguyen | H01H 59/0009 |
| | | | | 257/415 |
| 2013/0235001 | A1 * | 9/2013 | Yun | H03H 9/173 |
| | | | | 29/25.35 |
| 2014/0062296 | A1 * | 3/2014 | Yamazawa | H01J 37/32119 |
| | | | | 315/34 |
| 2015/0214011 | A1 * | 7/2015 | Kaneko | H01J 37/32119 |
| | | | | 315/111.21 |
| 2017/0084462 | A1 * | 3/2017 | Vukovic | H01P 1/38 |
| 2017/0298515 | A1 * | 10/2017 | Sabens | C30B 35/00 |
| 2017/0330773 | A1 * | 11/2017 | Chang | H01J 37/32422 |
| 2018/0286639 | A1 * | 10/2018 | Zucker | H01J 37/32449 |
| 2019/0051495 | A1 * | 2/2019 | Liang | C23C 16/511 |
| 2019/0122860 | A1 * | 4/2019 | Lee | H01L 21/6831 |
| 2021/0257196 | A1 * | 8/2021 | Ma | H01J 37/32715 |
| 2021/0280390 | A1 * | 9/2021 | Kaneko | H01J 37/32229 |
| 2022/0028661 | A1 * | 1/2022 | Ishida | H01J 37/32201 |
| 2022/0115208 | A1 * | 4/2022 | Kaneko | H01J 37/3244 |
| 2022/0130643 | A1 * | 4/2022 | Kaneko | H01J 37/32311 |
| 2024/0136154 | A1 * | 4/2024 | Kaneko | H01J 37/32165 |
| 2024/0186113 | A1 * | 6/2024 | Kaneko | H01J 37/32247 |
| 2024/0186114 | A1 * | 6/2024 | Kaneko | H01J 37/32247 |
| 2024/0186115 | A1 * | 6/2024 | Kaneko | H01J 37/32192 |
| 2024/0203692 | A1 * | 6/2024 | Oowada | H01J 37/32284 |
| 2024/0339300 | A1 * | 10/2024 | Kaneko | H01J 37/32247 |
| 2024/0339304 | A1 * | 10/2024 | Kaneko | H01J 37/32238 |

* cited by examiner

| C11 Fc(1) | C12 Fc(2) | C13 Fc(3) | C14 Fc(4) | C15 Fc(5) |
|---|---|---|---|---|
| C21 Fc(6) | C22 Fc(7) | C23 Fc(8) | C24 Fc(9) | C25 Fc(10) |
| C31 Fc(11) | C32 Fc(12) | C33 Fc(13) | C34 Fc(14) | C35 Fc(15) |
| C41 Fc(16) | C42 Fc(17) | C43 Fc(18) | C44 Fc(19) | C45 Fc(20) |
| C51 Fc(21) | C52 Fc(22) | C53 Fc(23) | C54 Fc(24) | C55 Fc(25) |

170

| C11<br><br>Fc(1) | C12<br><br>Fc(5) | C13<br><br>Fc(6) | C14<br><br>Fc(7) | C15<br><br>Fc(1) |
|---|---|---|---|---|
| C21<br><br>Fc(2) | C22<br><br>Fc(8) | C23<br><br>Fc(9) | C24<br><br>Fc(10) | C25<br><br>Fc(2) |
| C31<br><br>Fc(3) | C32<br><br>Fc(11) | C33<br><br>Fc(12) | C34<br><br>Fc(13) | C35<br><br>Fc(3) |
| C41<br><br>Fc(4) | C42<br><br>Fc(14) | C43<br><br>Fc(15) | C44<br><br>Fc(16) | C45<br><br>Fc(4) |
| C51<br><br>Fc(1) | C52<br><br>Fc(5) | C53<br><br>Fc(6) | C54<br><br>Fc(7) | C55<br><br>Fc(1) |

PLASMA PROCESSING APPARATUS AND PLASMA CONTROL METHOD

CROSS-REFERENCE TO RELATED APPLICATIONS

This application claims priority to Japanese Patent Application No. 2023-060604 filed on Apr. 4, 2023, the entire contents of which are incorporated herein by reference.

TECHNICAL FIELD

The present disclosure relates to a plasma processing apparatus and a plasma control method.

BACKGROUND

Japanese Laid-open Patent Publication No. 2009-245593 discloses a plasma processing apparatus for generating plasma by supplying microwaves for plasma excitation into a processing chamber.

SUMMARY

The present disclosure provides a plasma processing apparatus and a plasma control method capable of controlling plasma distribution and plasma density for each cell.

In accordance with an exemplary embodiment of the present disclosure, there is a plasma processing apparatus comprising: a processing chamber having a processing space; an electromagnetic wave generator configured to generate electromagnetic waves for plasma excitation to be supplied to the processing space; a dielectric having a first surface facing the processing space; an electromagnetic wave supply part configured to supply the electromagnetic waves to the processing space via the dielectric; and a resonator array structure disposed along the first surface of the dielectric in the processing chamber, wherein the resonator array structure includes a plurality of resonators, each resonator having a structure in which a conductive member is laminated on one surface of a dielectric plate, having a first resonance frequency, capable of resonating with magnetic field components of the electromagnetic waves and having a size smaller than a wavelength of the electromagnetic waves, and the resonator array structure is configured to form a plurality of cells surrounded by the resonators, and the plurality of cells include the resonators having different first resonance frequencies between the cells.

BRIEF DESCRIPTION OF THE DRAWINGS

FIG. 13 shows an example of the relationship between the cells and the resonance frequencies according to the first embodiment.

DETAILED DESCRIPTION

Hereinafter, embodiments of a plasma processing apparatus and a plasma control method will be described in detail with reference to the accompanying drawings. Further, the following embodiments are not intended to limit the present disclosure.

In a plasma processing apparatus using microwaves for plasma excitation, the power of microwaves supplied into the processing chamber may be increased in order to increase the electron density of plasma. The electron density of the plasma can be increased as the power of the micro-waves supplied into the processing chamber is increased.

Here, it is known that when the electron density of the plasma reaches a certain upper limit by increasing the power of the microwaves supplied into the processing chamber, the dielectric constant of the inner space of the processing chamber becomes negative. This upper limit value of the electron density is appropriately referred to as "cutoff den-sity." Further, the refractive index is known as an index indicating whether or not microwaves propagate in the space. The refractive index N is expressed by the following Eq. (1).

$$N = \sqrt{\varepsilon}\sqrt{\mu} \qquad \text{Eq. (1)}$$

Here, $\varepsilon$ indicates permittivity, and $\mu$ indicates magnetic permeability.

Since the magnetic permeability is generally positive, when the dielectric constant of the inner space of the processing chamber becomes negative, the refractive index of the inner space of the processing chamber becomes a pure imaginary number according to the above Eq. (1). Accord-ingly, the microwaves are attenuated and cannot propagate through the inner space of the processing chamber. When the electron density of the plasma reaches the cutoff density, the microwaves cannot propagate in the inner space of the processing chamber and, thus, the microwave power cannot be sufficiently absorbed by the plasma. As a result, it is difficult to increase the density of the plasma generated in the processing chamber over a wide area. Further, the generated plasma may spread on the ceiling plate, or the plasma generated from a plurality of plasma sources may interfere with each other, which makes it difficult to control the plasma density.

Therefore, there is a demand for a technique capable of increasing the plasma density over a wide range and con-trolling the plasma distribution and the plasma density for each cell.

First Embodiment

<Configuration of Plasma Processing Apparatus>

Figure 1:
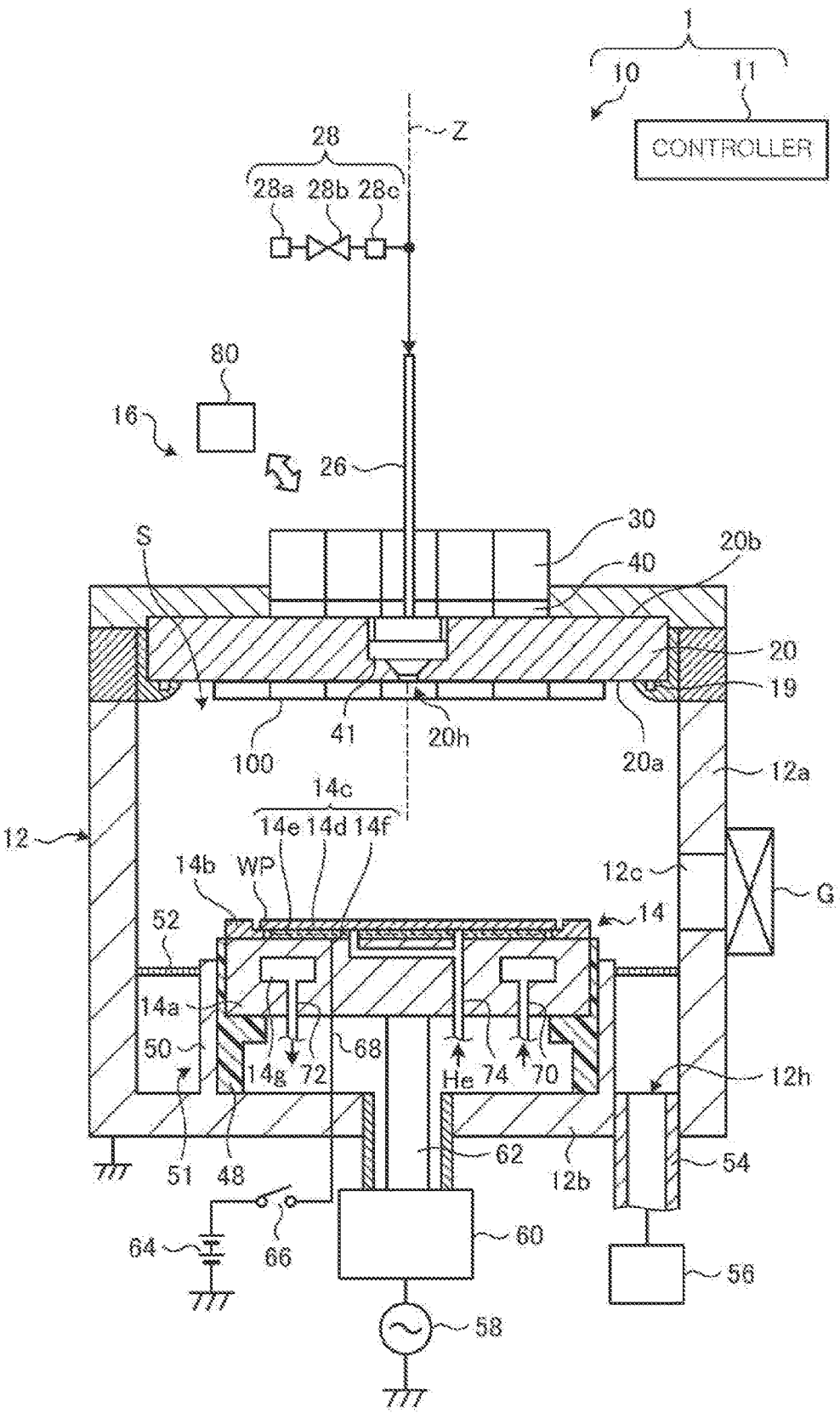
FIG. 1 is a schematic cross-sectional view showing an example of a configuration of a plasma processing apparatus according to a first embodiment.

FIG. 1 is a schematic cross-sectional view showing an example of a configuration of a plasma processing apparatus 1 according to the first embodiment. The plasma processing apparatus 1 includes an apparatus main body 10 and a controller 11. The apparatus main body 10 includes a processing chamber 12, a stage 14, a microwave output device (an example of an electromagnetic wave generator) 16, a dielectric window 20, and a resonator array structure 100.

The processing chamber 12 is formed in a substantially cylindrical shape and made of, e.g., aluminum having an anodically oxidized surface. The processing chamber 12 has therein a substantially cylindrical processing space S. The processing chamber 12 is frame grounded. Further, the processing chamber 12 has a sidewall 12a and a bottom portion 12b. The central axis of the sidewall 12a is defined as the Z-axis. The bottom portion 12b is disposed on the lower end side of the sidewall 12a. An exhaust port 12h for exhaust is disposed at the bottom portion 12b. The upper end of the sidewall 12a is opened. The inner wall surface of the sidewall 12a faces the processing space S. In other words, the sidewall 12a has an inner wall surface facing the processing space S.

An opening 12c for loading/unloading an object to be processed WP is formed in the sidewall 12a. The opening 12c is opened and closed by a gate valve G.

A dielectric window 20 is disposed at the upper end of the sidewall 12a, and closes the opening formed at the upper end of the sidewall 12a from the top. A bottom surface (an example of a first surface) 20a of the dielectric window (an example of a dielectric) 20 faces the processing space S. In other words, the dielectric window 20 has the bottom surface 20a facing the processing space S. An O-ring 19 is disposed between the dielectric window 20 and the upper end of the sidewall 12a.

The stage 14 is disposed in the processing chamber 12. The stage 14 is disposed to face the dielectric window 20 in the Z-axis direction. The space between the stage 14 and the dielectric window 20 serves as the processing space S. The object to be processed WP is placed on the stage 14.

The stage 14 has a base 14a and an electrostatic chuck 14c. The base 14a is made of a conductive material such as aluminum, and has a substantially disc shape. The base 14a is disposed in the processing chamber 12 such that the central axis of the base 14a substantially coincides with the Z-axis.

The base 14a is supported by a cylindrical support 48 made of an insulating material and extending in the Z-axis direction. A conductive cylindrical support 50 is disposed at the outer periphery of the cylindrical support 48. The cylindrical support 50 extends from the bottom portion 12b of the processing chamber 12 toward the dielectric window 20 along the outer periphery of the cylindrical support 48. An annular exhaust path 51 is formed between the cylindri-cal support 50 and the sidewall 12a.

An annular baffle plate 52 having a plurality of through-holes formed in a thickness direction is disposed above the exhaust path 51. The above-described exhaust port 12h is disposed below the baffle plate 52. An exhaust device 56 having a vacuum pump such as a turbo molecular pump, an automatic pressure control valve, or the like is connected to the exhaust port 12h through an exhaust line 54. The exhaust device 56 can reduce a pressure in the processing space S to a desired vacuum level.

The base 14a functions as a radio frequency (RF) elec-trode. An RF power supply 58 for RF bias is electrically connected to the base 14a via a power supply rod 62 and a matching unit 60. The RF power supply 58 supplies a bias power of a predetermined frequency (e.g., 13.56 MHz) suitable for controlling the energy of ions attracted to the object to be processed WP to the base 14a via the matching unit 60 and the power supply rod 62.

The matching unit 60 accommodates a matching box for matching the impedance on the RF power supply 58 side and the impedance on the load side, mainly the electrode, the plasma, and the processing chamber 12. The matching box includes a blocking capacitor for self-bias generation.

The electrostatic chuck 14c is disposed on the upper surface of the base 14a. The electrostatic chuck 14c attracts and holds the object WP to be processed using an electro-static force. The electrostatic chuck 14c has a substantially disc-shaped outer shape, and includes an electrode 14d, and an insulating film (dielectric film) 14e and an insulating film (dielectric film) 14f. The electrostatic chuck 14c is disposed on the upper surface of the base 14a such that the center axis of the electrostatic chuck 14c substantially coincides with the Z-axis. The electrode 14d of the electrostatic chuck 14c is made of a conductive film, and is disposed between the insulating film 14e and the insulating film 14f. A DC power supply 64 is electrically connected to the electrode 14d via a coated wire 68 and a switch 66. The electrostatic chuck 14c can attract and hold the object to be processed WP on the upper surface thereof by the electrostatic force generated by a DC voltage applied from the DC power supply 64. The upper surface of the electrostatic chuck 14c serves as a placing surface on which the object to be processed WP is placed, and faces the processing space S. In other words, the electrostatic chuck 14c has the upper surface, which is the placing surface, facing the processing space S. Further, an edge ring 14b is disposed on the base 14a. The edge ring 14b is disposed to surround the object to be processed WP and the electrostatic chuck 14c. The edge ring 14b may be referred to as "focus ring."

A channel 14g is formed in the base 14a. A coolant is supplied to the channel 14g from a chiller unit (not shown) through a line 70. The coolant supplied to the channel 14g is returned to the chiller unit through a line 72. The temperature of the base 14a is controlled by circulating the coolant whose temperature is controlled by the chiller unit in the channel 14g of the base 14a. By controlling the temperature of the base 14a, the temperature of the object WP on the electrostatic chuck 14c is controlled via the electrostatic chuck 14c on the base 14a.

Further, a line 74 for supplying a heat transfer gas such as He gas to the gap between the upper surface of the electrostatic chuck 14c and the backside of the object to be processed WP is formed in the stage 14.

The microwave output device 16 outputs microwaves (an example of electromagnetic waves) for exciting the processing gas supplied into the processing chamber 12. The microwave output device 16 includes a plurality of RF power supplies 30 and a host controller 80. The plurality of RF power supplies 30 are arranged to correspond to a plurality of cells C formed in a resonator array structure 100 to be described later. Further, the plurality of RF power supplies 30 are respectively connected to a plurality of antennas 40 arranged on the upper surface 20b of the dielectric window 20 to respectively correspond to the plurality of cells C.

The RF power supply 30 generates microwaves for plasma generation based on a predetermined set frequency. As will be described later, the set frequency may be different for different RF power supplies 30, or may be the same frequency for some of the RF power supplies 30. The RF power supply 30 generates microwaves with a set value of 2.45 GHz, for example. The RF power supply 30 receives a signal indicating power setting Pset and a set frequency Fset of an RF power from the host controller 80 to be described later. Further, the microwaves outputted from the RF power supply 30 are supplied to the antenna 40. A matching device may be disposed between each RF power supply 30 and each antenna 40.

The host controller 80 controls the plurality of RF power supplies 30 in response to instructions from the controller 11. The host controller 80 outputs power setting Pset and a set frequency Fset of microwaves to each RF power supply 30 based on the recipe inputted from the controller 11. Further, monitor values Pf mon and Pr mon, which will be described later, are inputted from each RF power supply 30 to the host controller 80. The host controller 80 outputs the inputted monitor values Pf mon and Pr mon to the controller 11. The host controller 80 may be included in the controller 11.

The antenna 40 supplies microwaves to the processing space S. The antenna 40 is an example of an electromagnetic wave supply part. Each antenna is disposed on the upper surface 20b of the dielectric window 20 to correspond to each RF power supply 30, and supplies microwaves to the processing space S via the dielectric window 20. The antenna 40 is, e.g., a slot antenna. The antenna 40 has a slot plate made of, e.g., a conductive metal and formed in a substantially disc shape. The antenna 40 is connected to the RF power supply 30 to form a coaxial structure.

The resonator array structure 100 is formed by arranging a plurality of resonators capable of resonating with magnetic field components of the microwaves and having a size smaller than the wavelength of the microwaves. The resonator array structure 100 is disposed in the processing chamber 12. The resonator array structure is also referred to as "meta material" and the resonator is also referred to as "meta atom."

Since the resonator array structure 100 is disposed in the processing chamber 12, the microwaves supplied to the processing space S by each antenna 40 can resonate with the plurality of resonators of the resonator array structure 100. Due to the resonance between the microwaves and the plurality of resonators, the microwaves can be efficiently supplied to the processing space S of the processing chamber 12, and the magnetic permeability of the processing space S can become negative. When the magnetic permeability of the processing space S is negative, even if the electron density of the plasma generated in the processing space S reaches the cutoff density and the permittivity of the processing space S is negative, the refractive index is a real number according to the above Eq. (1) and, thus, the microwaves can propagate in the processing space S. Accordingly, even if the electron density of the plasma generated in the processing space S reaches the cutoff density, the microwaves can propagate beyond the skin depth of the plasma, and the microwave power is efficiently absorbed by the plasma. As a result, it is possible to generate high-density plasma over a wide range beyond the plasma skin depth. In other word, in the plasma processing apparatus 1 of the present embodiment, the plasma density can be increased over a wide range by locating the resonator array structure 100 in the processing chamber 12.

Figure 2:
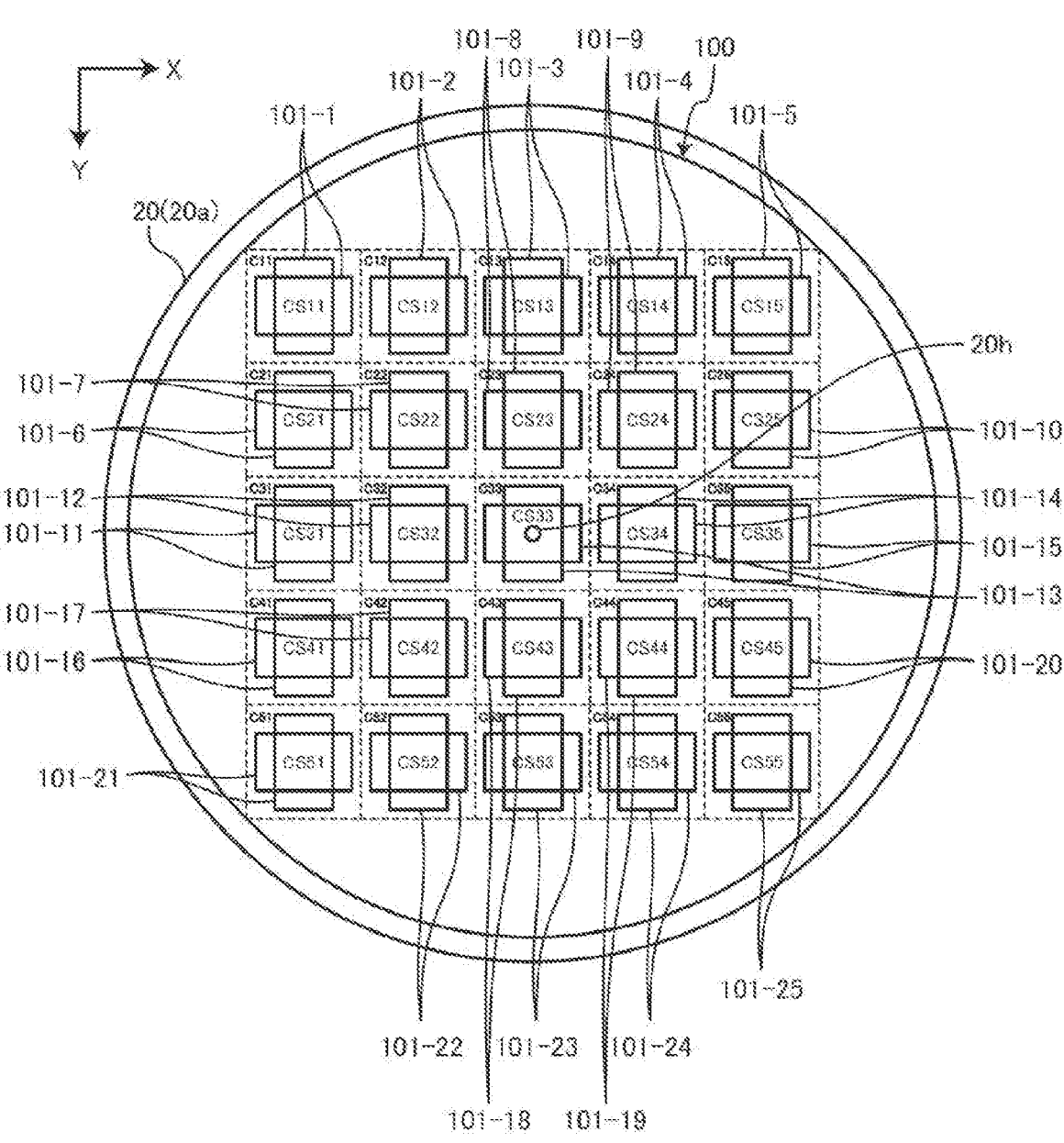
FIG. 2 is a bottom plan view showing an example of a configuration of a dielectric window and a resonator array structure according to the first embodiment.

Here, the specific configuration of the resonator array structure 100 will be described with reference to FIGS. 1 and 2. FIG. 2 is a bottom plan view showing an example of the configuration of the dielectric window 20 and the resonator array structure 100 according to the first embodiment. In FIG. 2, the bottom surface 20a of the dielectric window 20 has a disc shape.

As shown in FIGS. 1 and 2, the resonator array structure 100 is disposed along the bottom surface 20a of the dielectric window 20.

In the resonator array structure 100, a plurality of resonators 101-1 to 101-25, which are capable of resonating with the magnetic field components of the microwaves and have a size smaller than the wavelength of the microwave, are arranged to form cells C11 to C55, respectively. In other words, the resonators 101-1 to 101-25 are arranged such that the cells C11 to C55 form a grid of 5 rows and 5 columns. In other words, the cells C11 to C55 have different cell spaces CS11 to CS55, respectively. For example, the cell C11 is surrounded by the resonators 101-1 having the same resonance frequency, and the resonance frequencies of the resonators 101 in the cell C11 are different from those in adjacent cells C12, C21, and C22. The resonance frequencies 101-1 to 101-25 are examples of a first resonance frequency Fr. Although the resonators 101-1 to 101-25 have different resonance frequencies, they are collectively referred to as "resonator 101" unless they are distinguished from each other. In a specific configuration example, each of the plurality of resonators 101 includes at least one of resonators 101A and 101B shown in FIGS. 3 and 4. Each of the plurality of resonators 101 constitutes a series resonance circuit including a capacitor equivalent element and a coil equivalent element. The series resonance circuit is realized by patterning conductors on a plane.

Figure 3:
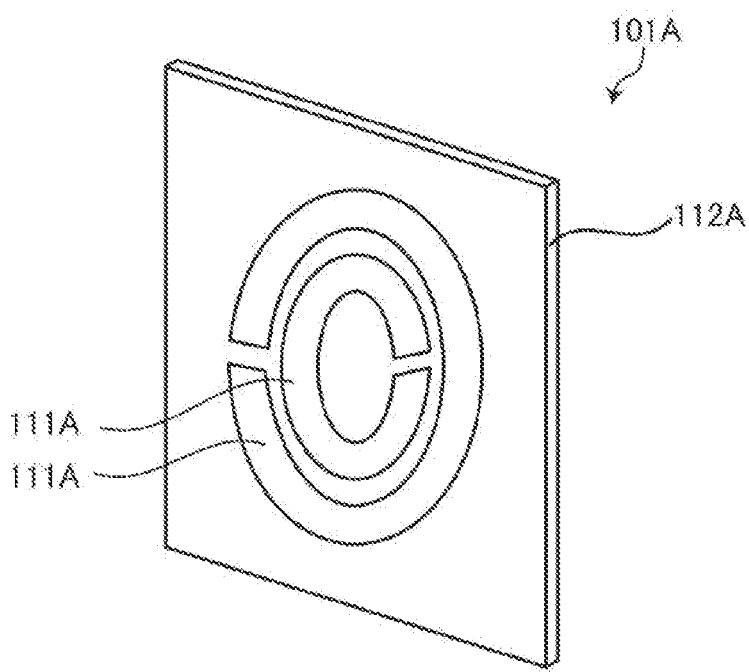
FIG. 3 shows an example of a configuration of a resonator according to the first embodiment.

FIG. 3 shows an example of the configuration of the resonator 101A according to the first embodiment. The resonator 101A shown in FIG. 3 has a structure in which two concentrical C-shaped ring members 111A made of conductors and arranged in opposite directions are laminated on one surface of a dielectric plate 112A. The capacitor equivalent element is formed on the opposing surfaces of the inner ring member 111A and the outer ring member 111A, or is formed at both ends of each ring member 111A. The coil equivalent element is formed along each ring member 111A. Accordingly, the resonator 101A can constitute the series resonance circuit.

Figure 4:
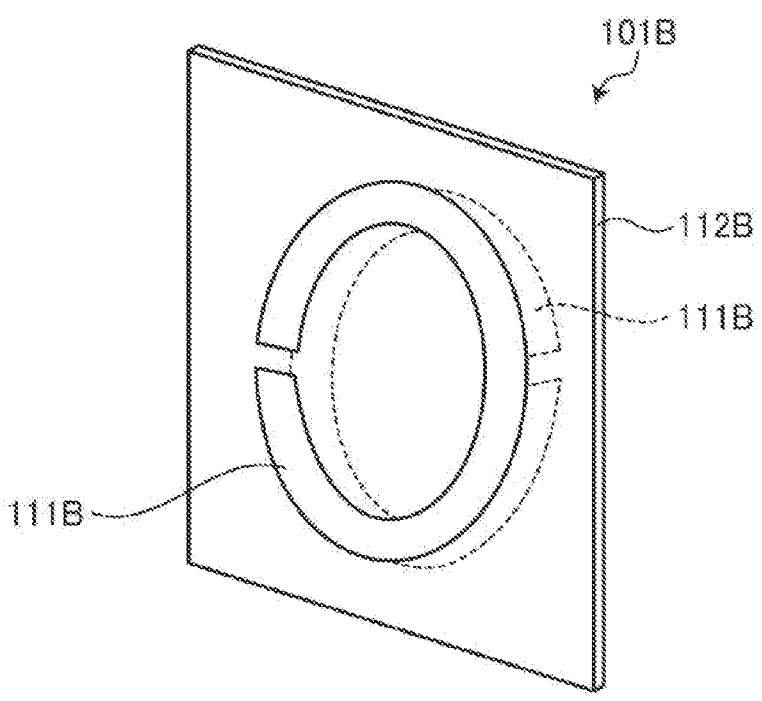
FIG. 4 shows an example of the configuration of the resonator according to the first embodiment.

FIG. 4 shows an example of the configuration of the resonator 101B according to the first embodiment. The resonator 101B shown in FIG. 4 has a structure in which a dielectric plate 112B is disposed between two C-shaped ring members 111B made of conductors and arranged adjacent to each other in opposite directions. In other words, in the resonator 101B, the dielectric plate 112B is embedded between the two C-shaped ring members 111B arranged in opposite directions. The capacitor equivalent element is formed on the opposing surfaces of the two C-shaped ring members 111B, or is formed at both ends of each ring member 111B. The coil equivalent element is formed along each ring member 111B. Accordingly, the resonator 101B can constitute the series resonance circuit. The resonator 101B may be formed for each set of two C-shaped ring members 111B.

Figure 5:
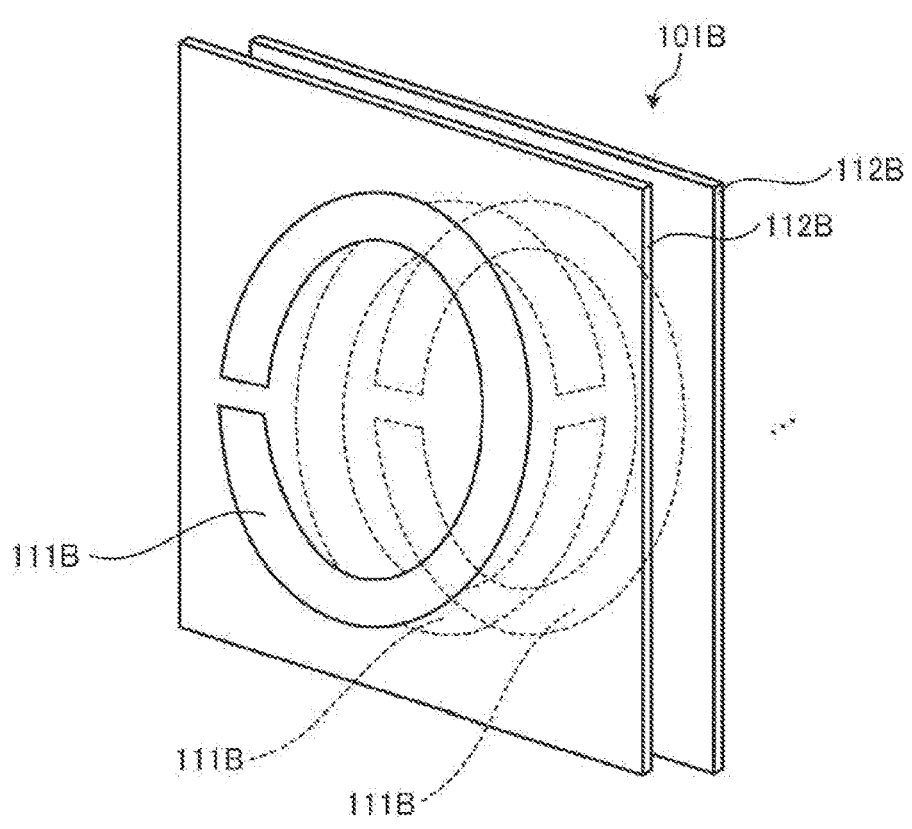
FIG. 5 shows another example of the configuration of the resonator according to the first embodiment.

In the resonator 101B shown in FIG. 4, the number of arrangement (hereinafter, also referred to as "the number of lamination") of the ring members 111B is two. However, the number of lamination of the ring members 111B may be greater than two. FIG. 5 shows another example of the configuration of the resonator 101B according to the first embodiment. The resonator 101B shown in FIG. 5 has a structure in which the dielectric plate 112B is disposed between N (N≥2)–number of C-shaped ring members 111B made of conductors and arranged adjacent to each other in opposite directions. Even with this structure, the resonator 101B can constitute the series resonance circuit.

Figure 6:
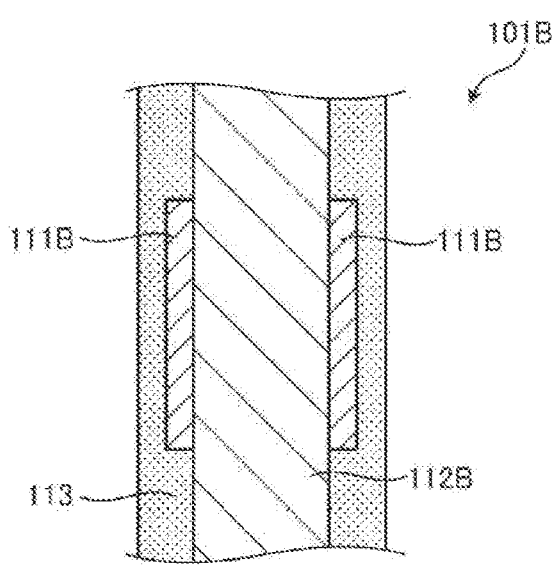
FIG. 6 shows an example of a cross section of the resonator according to the first embodiment.

An insulating coating film may be formed on each of the plurality of resonators 101. FIG. 6 shows an example of the cross section of the resonator 101B according to the first embodiment. FIG. 6 shows the side cross section of the resonator 101B shown in FIG. 4. An insulating coating film (an example of a dielectric film) 113 is formed on the surface of the resonator 101B. The coating film 113 is made of, e.g., ceramic. The thickness of the coating film 113 is, e.g., within a range of 0.001 mm to 2 mm. By forming the insulating coating film 113 on each of the plurality of resonators 101, the occurrence of abnormal discharge in each of the plurality of resonators 101 can be suppressed.

Referring back to FIGS. 1 and 2, a conduit 26 connected to a through-hole 20h formed in the dielectric window 20 is disposed at the center of the resonator array structure 100, i.e., in the cell C33. The conduit 26 is connected to a gas supply part 28.

The gas supply part 28 supplies a processing gas for processing the object WP to be processed to the conduit 26. The gas supply part 28 includes a gas supply source 28a, a valve 28b, and a flow rate controller 28c. The gas supply source 28a is a processing gas supply source. The valve 28b controls supply and stop of supply of the processing gas from the gas supply source 28a. The flow rate controller 28c is, e.g., a mass flow controller or the like, and controls the flow rate of the processing gas from the gas supply source 28a.

The apparatus main body 10 includes an injector 41. The injector 41 supplies a gas from the conduit 26 to the through-hole 20h formed in the dielectric window 20. The gas supplied to the through-hole 20h of the dielectric window 20 is injected into the processing space S, and is excited by the microwaves supplied from the antenna 40 to the processing space S through the dielectric window 20. Accordingly, the processing gas is turned into plasma in the processing space S, and the object to be processed WP is processed by ions, radicals, and the like contained in the plasma.

The controller 11 has a processor, a memory, and an input/output interface. The memory stores programs, process recipes, and the like. The processor reads a program from the memory and executes it, thereby collectively controlling individual components of the apparatus main body 10 via the input/output interface based on the process recipe stored in the memory.

When plasma is generated in the processing space S, for example, the controller 11 controls the microwaves supplied to the processing space S by each antenna 40 and the plurality of resonators 101 to resonate in a target frequency band higher than the resonance frequencies of the plurality of resonators 101. In other words, the controller 11 controls the RF power supplies 30 via the host controller 80 such that the microwaves and the resonators 101-1 to 101-25 resonate in a target frequency band higher than the resonance frequencies of the resonators 101-1 to 101-25. Here, the resonance frequency is, e.g., a frequency at which the transmission characteristic values (e.g., S21 value) of the plurality of resonators 101 (the resonators 101-1 to 101-25) become minimum.

Figure 7:
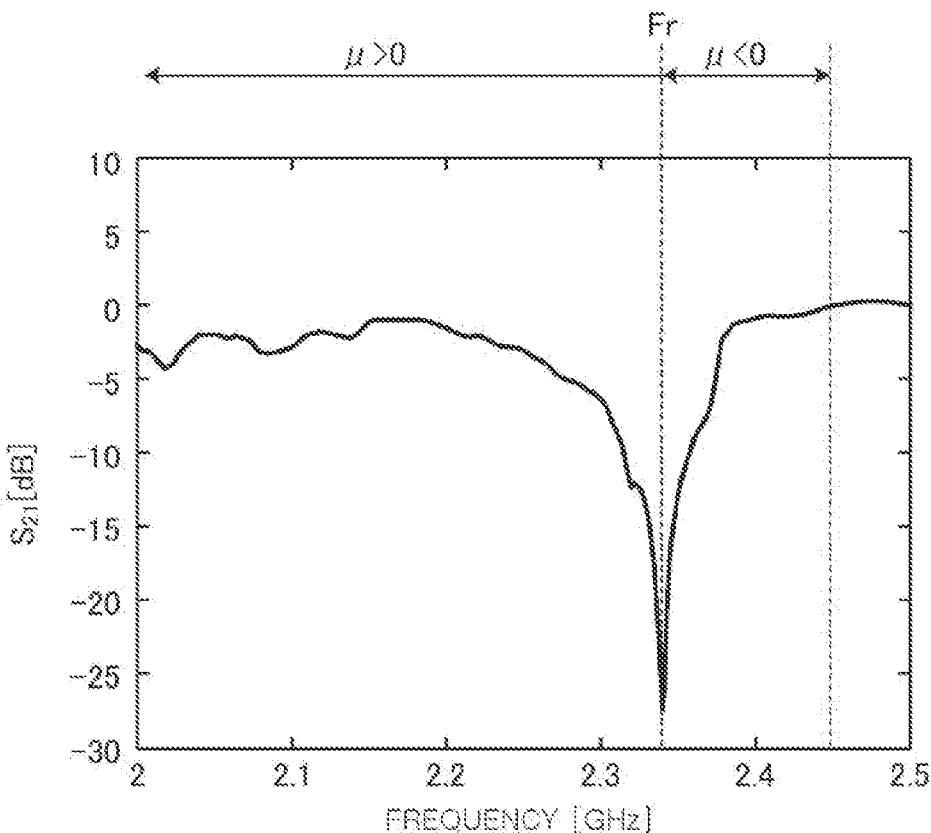
FIG. 7 shows an example of the relationship between an S21 value of the resonator and a frequency of microwaves.

FIG. 7 shows an example of the relationship between the S21 value of the resonator and the frequency of the microwave. In FIG. 7, a cell C corresponding to a certain antenna 40 will be described as an example. When the frequency of the microwaves supplied to the processing space S by the antenna 40 is equal to the resonance frequency Fr (e.g., about 2.35 GHz) of the plurality of resonators 101 of the cell C, the S21 value becomes minimum. In other words, the resonance between the microwaves and the plurality of resonators 101 of the cell C occurs. The resonance between the microwaves and the plurality of resonators 101 of the cell C is maintained even in a predetermined frequency band (e.g., about 0.1 GHz) higher than the resonance frequency Fr of the plurality of resonators 101 of the cell C. In a predetermined frequency band higher than the resonance frequency Fr of the plurality of resonators 101 of the cell C, both the dielectric constant and the magnetic permeability of the processing space S can become negative due to the resonance between the microwaves and the plurality of resonators 101 of the cell C. In other words, as can be seen from the above Eq. (1), the microwaves can propagate in the processing space S. The target frequency band of the present embodiment is set to a predetermined frequency band (e.g., about 0.1 GHz) higher than the resonance frequency Fr of the plurality of resonators 101 of the cell C for each RF power supply 30 (each antenna 40). It is preferable that the target frequency band is, e.g., within 0.05 times the resonance frequency Fr of the plurality of resonators 101 of the cell C1. In the following description, the resonance frequency Fr of the resonator 101 may be referred to as "first resonance frequency Fr."

Figure 8:
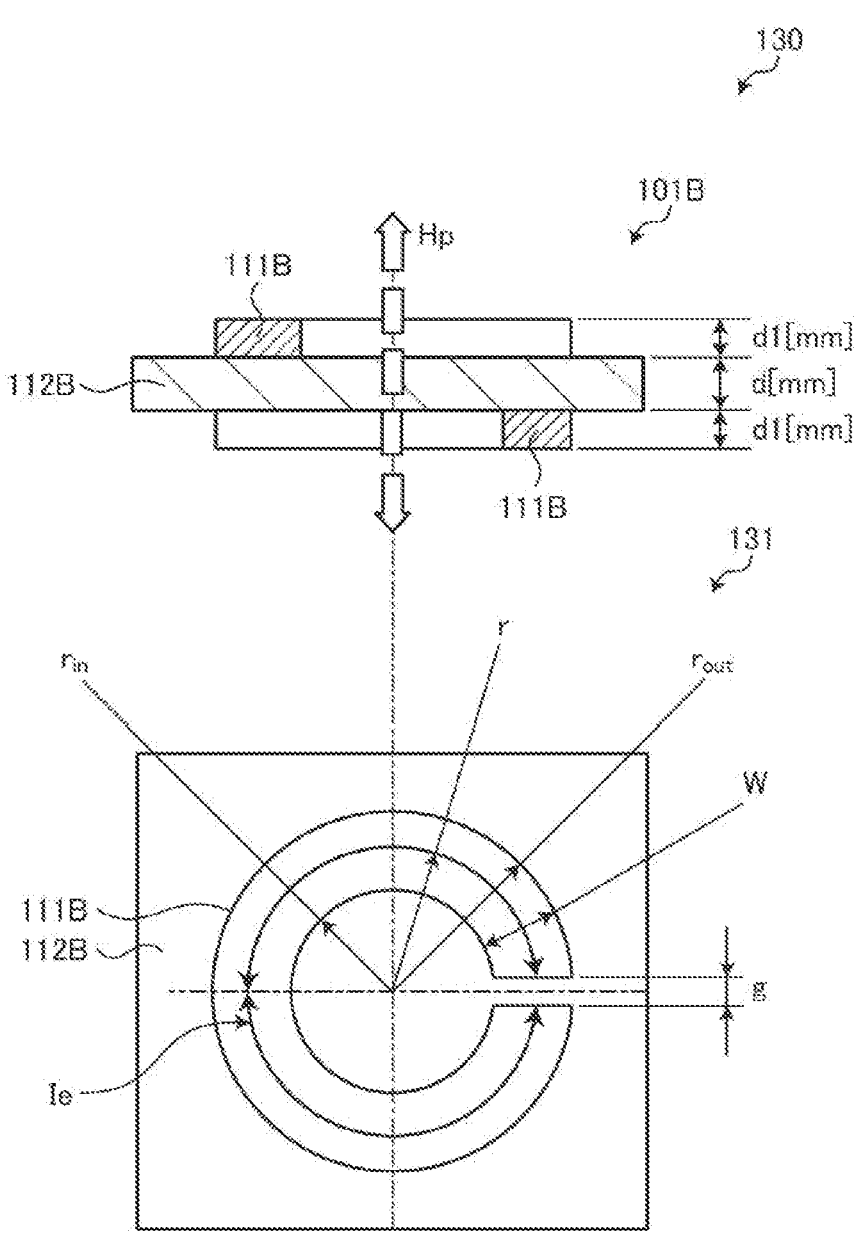
FIG. 8 shows an example of a resonance frequency of the resonator according to the first embodiment.

Next, the resonance frequency of the resonator 101B will be described with reference to FIG. 8. FIG. 8 is an explanatory diagram showing an example of the resonance frequency of the resonator according to the first embodiment. As shown in a cross section 130 of FIG. 8, the resonator 101B may have a structure in which the dielectric plate 112B is embedded between two C-shaped ring members 111B. In this case, when magnetic field Hp penetrating through the C-shaped ring members 111B of the resonator 101B is generated, an induced current Ie is generated at the C-shaped ring members 111B. In FIG. 8, the coating film 113 surrounding the outside of the C-shaped ring member 111B is omitted.

On the other hand, the resonance frequency of the resonator 101B is determined from dimensions in the cross section 130 and a plane 131 of FIG. 8. In other words, the resonance frequency of the resonator 101B can be determined from the dimensions of the C-shaped ring members 111B and the thickness of the dielectric plate 112B embedded between the two C-shaped ring members 111B, as can be seen from the following Eqs. (2) to (5). Eq. (2) is an equation for determining an inductance $L_{MA}$ of the resonator 101B. Eq. (3) is an equation for calculating a capacitance $C_{half}$ corresponding to an upper half or a lower half of the plane 131 in the capacitance CMA of the resonator 101B. Eq. (4) is an equation for determining a capacitance CMA of the resonator 101B. Eq. (5) is an equation for determining the resonance frequency Fr of the resonator 101B.

$$L_{MA} = \mu_0 r(\log(4\pi) - 1) \tag{2}$$

$$C_{half} = \varepsilon\varepsilon_0 \frac{s}{d} = \varepsilon\varepsilon_0 \frac{(\pi(r_{out}^2 - r_{in}^2) - S_{split})/2}{d_{PTFE}} \tag{3}$$

$$C_{MA} = \frac{1}{\dfrac{1}{C_{half}} + \dfrac{1}{C_{half}}} \tag{4}$$

$$Fr = \frac{1}{2\pi\sqrt{L_{MA}C_{MA}}} \tag{5}$$

In Eq. (2), r indicates the radius from the center of the C-shaped ring member 111B to the center of the width of the C shape, and $\mu_0$ indicates the magnetic permeability of vacuum. In Eq. (3), $C_{half}$ indicates the capacitance corresponding to the upper half or the lower half of the plane 131 in the capacitance of the resonator 101B. Further, in Eq. (3), $\varepsilon$ indicates the dielectric constant, $\varepsilon_0$ indicates the permittivity of vacuum (electric constant), S indicates the area of the upper half or the lower half of the C-shaped ring member 111B, and d indicates the gap between the two C-shaped ring members 111B. Further, in Eq. (3), $r_{out}$ indicates the outer radius of the C-shaped ring member 111B, $r_{in}$ indicates the inner radius of the C-shaped ring member 111B, and $S_{split}$ indicates the area of the C-shaped gap of the C-shaped ring member 111B. Further, $S_{split}$ is approximately determined as the area of a rectangle from the width W of the C-shaped ring member 111B and the C-shaped gap g shown on the plane 131. Further, in Eq. (3), $d_{PTFE}$ indicates the gap between the two C-shaped ring members 111B in the case of using polytetrafluoroethylene (PTFE) for the dielectric plate

112B. As shown in the cross section 130, thicknesses d1 of the two C-shaped ring members 111B are preferably the same.

In Eq. (5), the resonance frequency Fr of the resonator 101B is determined based on the inductance $L_{MA}$ and the capacitance CMA obtained by Eqs. (2) and (4). Further, the resonance frequency Fr decreases as the outer radius $r_{out}$ and the inner radius $r_{in}$ of the C-shaped ring member 111B increase, and decreases as the thickness d of the dielectric plate 112B embedded between the two C-shaped ring members 111B decreases. Further, the resonance frequency Fr decreases as the number of lamination of the C-shaped ring members 111B increases. In other words, by adjusting the outer radius $r_{out}$ or the inner radius $r_{in}$ of the ring member 111B and the thickness d of the dielectric plate 112B, the resonators 101-1 to 101-25 having different first resonance frequencies Fr can be formed. In the present embodiment, each of the C-shaped ring members 111A and 111B is described as a circular ring having a notch, but the present disclosure is not limited thereto. The ring member does not necessarily have a circular ring shape, and may have a shape in which any one of an elliptical ring, a triangular ring, a quadrilateral ring, and a polygonal ring has a notch (corresponding to the gap g).

Figure 9:
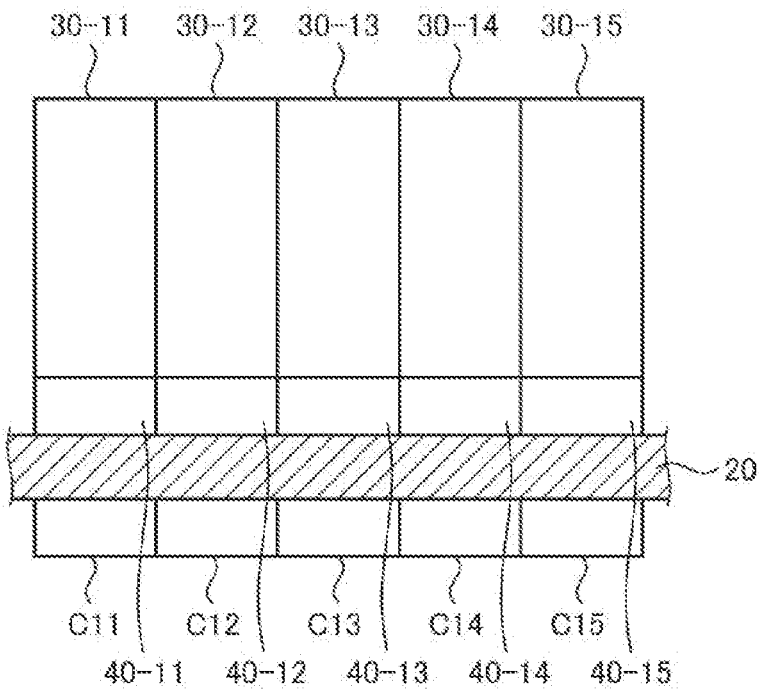
FIG. 9 shows an example of correspondence between RF power supplies and cells according to the first embodiment.
Figure 10:
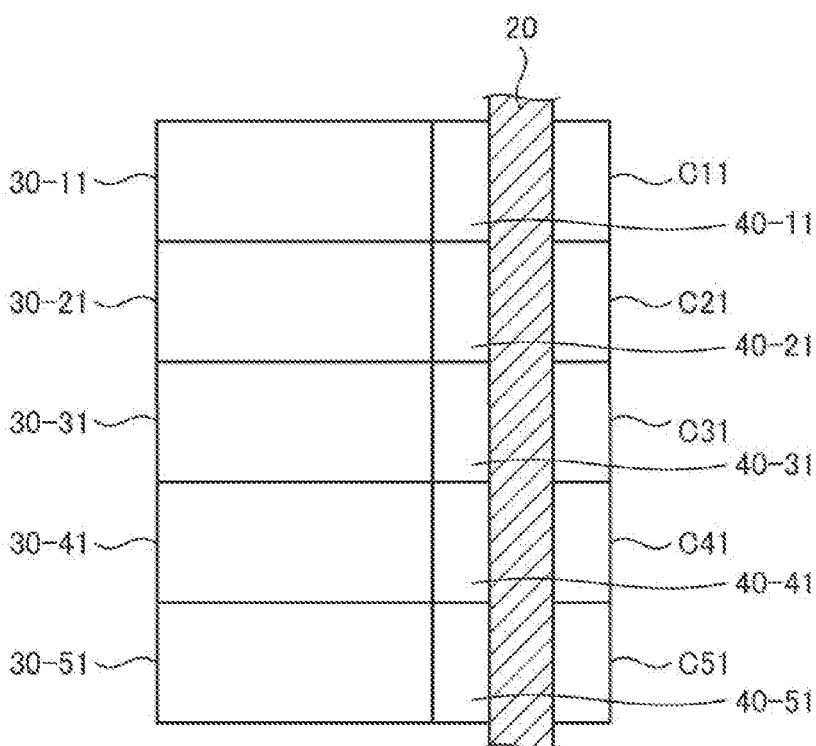
FIG. 10 shows an example of correspondence between the RF power supplies and the cells according to the first embodiment.

Next, the relationship of the plurality of RF power supplies 30, the antennas 40, and the cells C will be described with reference to FIGS. 9 and 10. FIGS. 9 and 10 show an example of correspondence between the RF power supplies and the cells according to the first embodiment. In FIG. 9, the cells C11 to C15 are shown as an example of the resonator array structure 100 in the X direction. In FIG. 10, the cells C11 to C51 are shown as an example of the resonator array structure 100 in the Y direction.

As shown in FIG. 9, the RF power supplies 30-11 to 30-15 and the antennas 40-11 to 40-15 are arranged above the cells C11 to C15 with the dielectric window 20 interposed therebetween. Further, as shown in FIG. 10, the RF power supplies 30-11 to 30-51 and the antennas 40-11 to 40-51 are arranged above the cells C11 to C51 with the dielectric window 20 interposed therebetween. Similarly, in the cells C22 to C25, C32 to C35, C42 to C45, C52 to C55, the RF power supplies 30-22 to 30-25, 30-32 to 30-35, 30-42 to 30-45, 30-52 to 30-55 are arranged respectively. Further, in the cells C22 to C25, C32 to C35, C42 to C45, C52 to C55, the antennas 40-22-40-25, 40-32-40-35, 40-42-40-45, 40-52 to 40-55 are arranged respectively.

Here, in the cell C11, for example, plasma is generated in the cell space CS11 by the microwaves supplied from the antenna 40-11 by the RF power supply 30-11. In other words, the plasma density of the plasma generated in the cell space CS11 of the cell C11 is controlled by the microwaves supplied from the antenna 40-11 by the RF power supply 30-11. In other words, in the cell spaces CS11 to CS55 of the cells C11 to C55, the plasma density is controlled by the corresponding RF power supplies 30-11 to 30-55, respectively.

Figure 11:
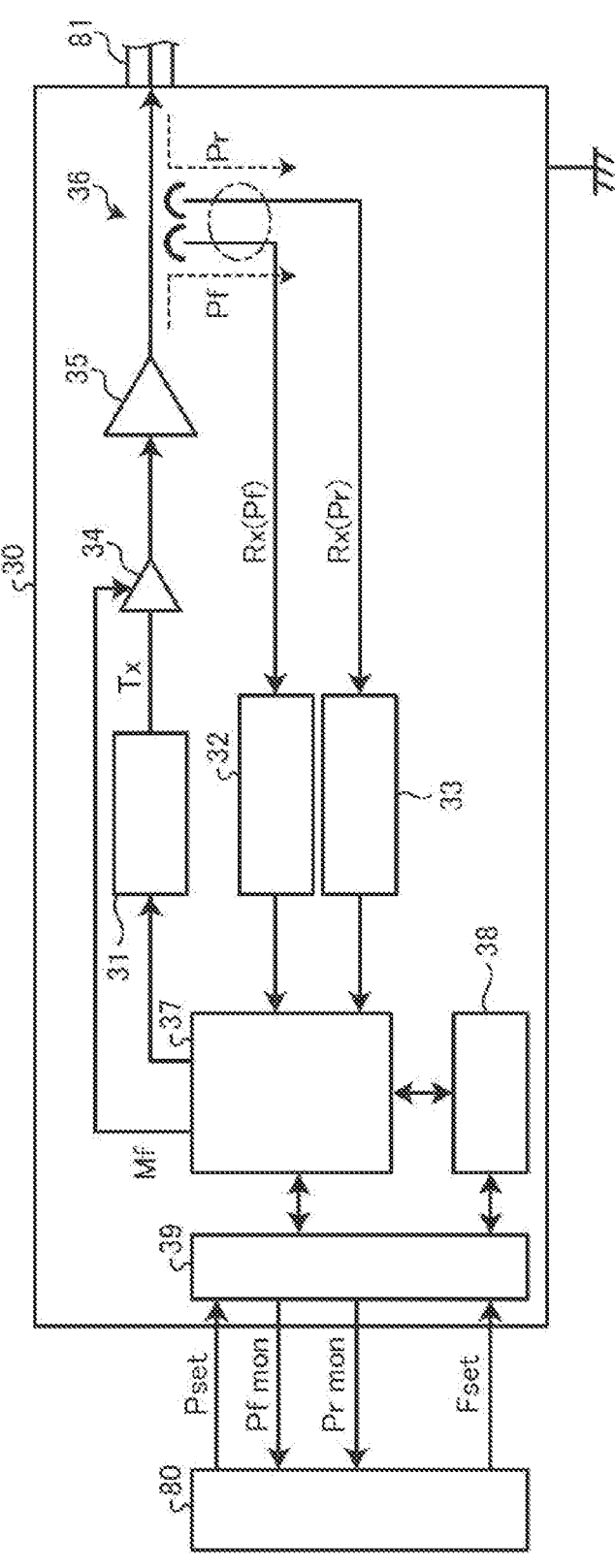
FIG. 11 is a block diagram showing an example of a functional configuration of the RF power supply according to the first embodiment.

Next, the functional configuration of the RF power supply 30 will be described with reference to FIG. 11. FIG. 11 is a block diagram showing an example of the functional configuration of the RF power supply according to the first embodiment. As shown in FIG. 11, the RF power supply 30 includes a VF converter 31, demodulators 32 and 33, a pre-amplifier 34, an amplifier 35, a directional coupler 36, an operation part 37, a storage part 38, and an input/output part 39.

The VF converter 31 is a voltage-controlled frequency generator. When a voltage based on the set frequency Fset is inputted from the operation part 37, the VT converter 31 generates microwaves (RF signal) having a frequency corresponding to the input voltage. The generated microwaves are outputted to the pre-amplifier 34. The generated microwaves are single-peak microwaves. The VF converter 31 may be of any other type, such as a direct digital synthesizer (DDS) as long as it can generate microwaves of the set frequency Fset.

The demodulators 32 and 33 demodulate the traveling wave power Pf and the reflected wave power Pr inputted from the directional coupler 36, respectively, and output the waveform data of the demodulated traveling wave power Pf and the reflected wave power Pr to the operation part 37.

The pre-amplifier 34 can change the amplification factor in response to a power command value Mf inputted from the operation part 37. The pre-amplifier 34 amplifies the microwaves inputted from the VF converter 31 with an amplification factor corresponding to the power command value Mf, and outputs it to the amplifier 35.

The amplifier 35 amplifies the microwaves inputted from the pre-amplifier 34 to a predetermined power level. The amplifier 35 outputs the amplified microwaves to the antenna 40 as microwaves for plasma generation via the directional coupler 36 and the coaxial waveguide 81. Although it is desired from the viewpoint of power loss that the output from the coaxial waveguide 81 of the RF power supply 30 is directly supplied to the antenna 40, the microwaves may be supplied to the antenna 40 via a relay cable such as a coaxial cable due to the installation space for the RF power supply 30 and a matching device (not shown).

The directional coupler 36 is disposed on the transmission path between the amplifier 35 and the antenna 40, and extracts the traveling wave power Pf and the reflected wave power Pr. The extracted traveling wave power Rx (Pf) is inputted to the demodulator 32. Further, the extracted reflected wave power Rx (Pr) is inputted to the demodulator 33. In the following description, the traveling wave power Rx (Pf) may be simply referred to as "traveling wave power Pf" and the reflected wave power Rx (Pr) may be simply referred to as "reflected wave power Pr."

The operation part 37 is a controller for controlling the RF power supply 30. The microwave power setting Pset and the set frequency Fset are inputted to the operation part 37 from the host controller 80 via the input/output part 39. The operation part 37 executes the process of calculating the traveling wave power Pf, the process of calculating the reflected wave power Pr, and the setting of the power command value Mf. The operation part 37 outputs a voltage based on the set frequency Fset to the VF converter 31, and outputs the power command value Mf to the pre-amplifier 34. The power command value Mf is controlled by so-called load control (constant power control). Further, the operation part 37 outputs a monitor value Pf mon of the traveling wave power Pf and a monitor value Pr mon of the reflected wave power Pr to the host controller 80.

The storage part 38 stores information used in each process in the operation part 37. The storage part 38 stores various information, e.g., the Pf component and the Pf phase component of the traveling wave power Pf, and the Pr component and the Pr phase component of the reflected wave power Pr.

Figure 12:
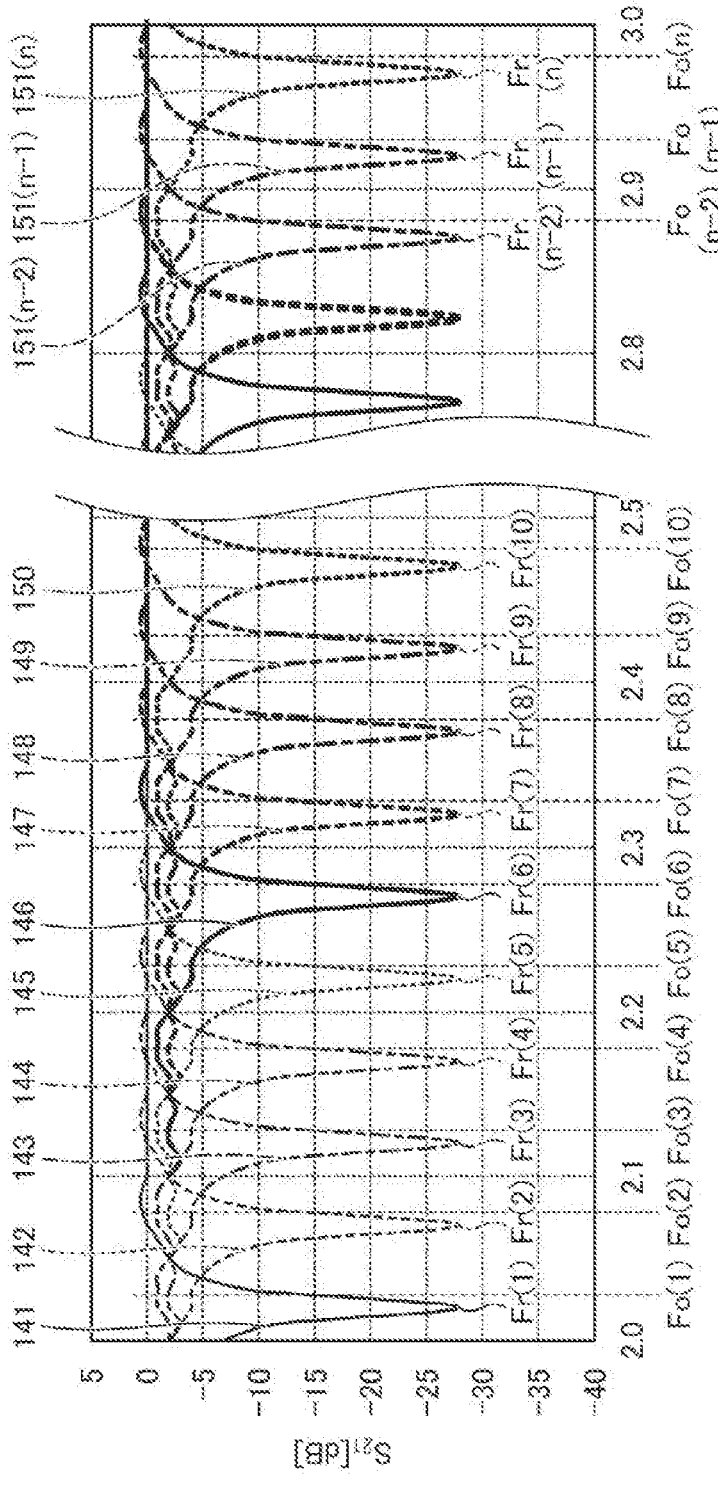
FIG. 12 shows an example of setting of the resonance frequencies of the resonators according to the first embodiment.

Next, the setting of the resonance frequency of the resonator and the relationship between cells and resonance frequencies will be described with reference to FIGS. 12 and 13. FIG. 12 shows an example of setting the resonance frequency of the resonator according to the first embodiment. As shown in FIG. 12, the plurality of resonators 101 have different first resonance frequencies Fr(1) to Fr(n) within a range of 2 GHz to 3 GHz, for example, as can be seen from graphs 141 to 150, . . . , 151(n–2), 151(n–1), 151(n). The first resonance frequencies Fr(1) to Fr(n) are set at a predetermined interval D to be within a range of 2 GHz to 3 GHz with respect to 2.45 GHz, for example. In other words, the first resonance frequency Fr(n) can be expressed as Fr(n)=K+Dn [GHz] (K being lower limit frequency). For example, when K is 2 GHz, D is 0.1, and n is 10, the first resonance frequencies Fr(1) to Fr(10) are set at an interval of 0.1 GHz within a range of 2 GHz to 3 GHz. In order to resonate each of the plurality of resonators 101 having the first resonance frequencies Fr(1) to Fr(n), the microwaves of the output frequencies (target frequencies) Fo(1) to Fo(n) are supplied from each RF power supply 30. The output frequency Fo is, e.g., a frequency (e.g., 2.50 GHz) that is within 1.05 times the first resonance frequency Fr (e.g., 2.45 GHz).

FIG. 13 shows an example of the relationship between cells and resonance frequencies according to the first embodiment. A setting example 160 of FIG. 13 shows second resonance frequencies Fc(1) to Fc(25) as cells in the cells C11 to C55 of FIG. 2. In other words, if the resonance frequencies of the resonators 101-1 to 101-25 are set to the first resonance frequency Fr, the cells C11 to C55 have the second resonance frequency Fc as a cell corresponding to the first resonance frequency Fr of the surrounded resonators 101-1 to 101-25. As described above, in the first embodiment, the cells C11 to C55 have different second resonance frequencies Fc(1) to Fc(25). Accordingly, in the cells C11 to C55, plasma is generated in the cell spaces CS11 to CS55 by the microwaves supplied from the RF power supply 30 and the antenna 40 corresponding to the cells C11 to C55, respectively. In other words, for example, the resonators 101-2, 101-6, and 101-7 forming the adjacent cells C12, C21, and C22 do not resonate with the microwaves supplied from the RF power supply 30 and the antenna 40 corresponding to the cell C11, so that is not generated in these cell spaces. Hence, the plasma density can be independently controlled for each of the cells C11 to C55. In other words, the plasma distribution and the plasma density can be controlled for each cell by changing the microwave power outputted by the corresponding RF power supply 30 for each cell C11 to C55.

The relationship of the resonance frequency, the refractive index, the permittivity, and the magnetic permeability regarding the propagation of electromagnetic waves to multiple resonators was reported by D. R. Smith, D. C. Vier, Th. Koschny and C. M. Soukoulis in "Electromagnetic parameter retrieval from inhomogeneous metamaterials" of "PHYSICAL REVIEW E 71, 036617 (2005)."

By resonating the microwaves and the plurality of resonators 101 in a target frequency band higher than the resonance frequency Fr of the plurality of resonators 101, the microwaves can propagate beyond the skin depth of the plasma even when the electron density of the plasma reaches the cutoff density. Therefore, the microwave power can be efficiently absorbed by the plasma. As a result, it is possible to generate high-density plasma over a wide range beyond the skin depth of the plasma. In other words, in the plasma processing apparatus 1 of the present embodiment, the plasma density can be increased over a wide range by resonating the microwaves and the plurality of resonators 101 in a target frequency band higher than the resonance frequency Fr of the plurality of resonators 101. Further, in the plasma processing apparatus 1 of the present embodiment, the RF power supply 30 is provided for each cell C of the resonator array structure 100, and the second resonance frequency Fc is different between adjacent cells C, so that the plasma distribution and the plasma density can be controlled for each cell C. In other words, in the plasma processing apparatus 1 of the present embodiment, the processing speed can be controlled while changing the plasma density at a specific location on the object to be processed WP, so that the processing speed of the entire object to be processed WP can be controlled.

Modifications 1 to 7

Figure 14:
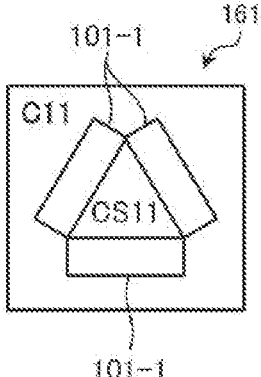
FIG. 14 shows an example of a cell space according to Modification 1.

Next, Modifications 1 to 7 of the first embodiment will be described with reference to FIGS. 14 to 20. FIG. 14 shows an example of a cell space according to Modification 1. In Modification 1 of FIG. 14, the cell C11 will be described as an example. In the arrangement example 161 of FIG. 14, the cell space CS11 in the cell C11 is surrounded by three resonators 101-1 to have an equilateral triangular shape in plan view. In the arrangement example 161, the cell C11 has a quadrilateral shape, and the equilateral triangular cell space CS11 is disposed therein. However, the cell C11 may have an equilateral triangular shape surrounding the three resonators 101-1. Further, the cell space CS11 may have a triangular shape with different side lengths.

Figure 15:
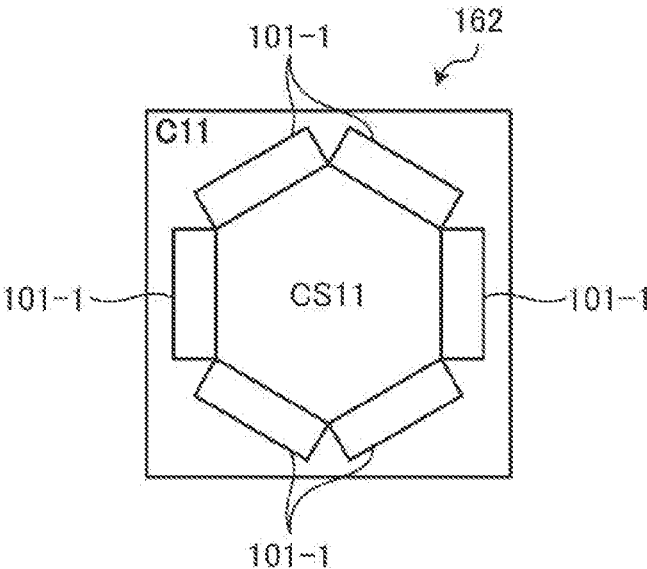
FIG. 15 shows an example of a cell space according to Modification 2.

FIG. 15 shows an example of a cell space according to Modification 2. In Modification 2 of FIG. 15, the cell C11 will be described as an example. In the arrangement example 162 of FIG. 15, the cell space CS11 in the cell C11 is surrounded by six resonators 101-1 to have a regular hexagonal shape in plan view. In the arrangement example 162, the cell C11 has a quadrilateral shape and a regular hexagonal cell space CS11 is disposed therein. However, the cell C11 may have a regular hexagonal shape surrounding the six resonators 101-1. Further, the cell space CS11 may have a hexagon shape with different side lengths.

Figure 16:
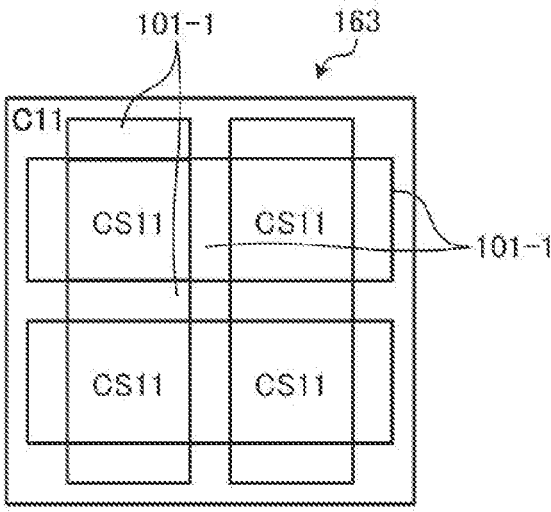
FIG. 16 shows an example of a cell space according to Modification 3.

FIG. 16 shows an example of a cell space according to Modification 3. In Modification 3 of FIG. 16, the cell C11 will be described as an example. In the arrangement example 163 of FIG. 16, twelve resonators 101-1 are arranged in a grid shape so that four cell spaces CS11 are formed in the cell C11. In this case, the resonator 101-1 between the cell spaces CS11 is shared. In the arrangement example 163, the microwaves outputted from one RF power supply and one antenna 40 are supplied to four cell spaces CS11 belonging to the cell C11, thereby generating plasma in each cell space CS11. In other words, in the arrangement example 163, the cell C11 is divided into four cell spaces CS11.

Figure 17:
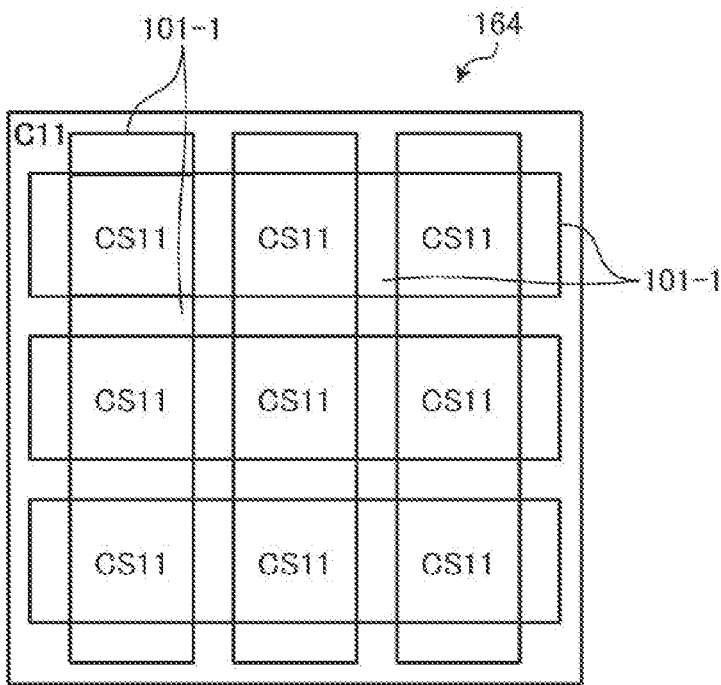
FIG. 17 shows an example of a cell space according to Modification 4.

FIG. 17 shows an example of a cell space according to Modification 4. In Modification 4 of FIG. 17, the cell C11 will be described as an example. In the arrangement example 164 of FIG. 17, twenty-four resonators 101-1 are arranged in a grid shape so that nine cell spaces CS11 are formed in the cell C11. In this case, the resonator 101-1 between the cell spaces CS11 is shared. In the arrangement example 164, the microwaves outputted from one RF power source and one antenna 40 are supplied to nine cell spaces CS11 belonging to the cell C11, thereby generating plasma in each cell space CS11. In other words, in the arrangement example 164, the cell C11 is divided into nine cell spaces CS11. The number of vertical and horizontal lines of the grid shape of the cell space CS11 may vary.

Figure 18:
FIG. 18 shows an example of the relationship between cells and resonance frequencies according to Modification 5.

FIG. 18 shows an example of the relationship between cells and resonance frequencies according to Modification 5. In a setting example 170 of FIG. 18, the second resonance frequency Fc is shared by some cells C to reduce the number of the second resonance frequencies compared to that in the setting example 160 of FIG. 13. The setting example 170 shows second resonance frequencies Fc(1) to Fc(16) as cells in the cells C11 to C55 of FIG. 2. In other words, the cells C11 to C55 have the second resonance frequencies Fc as cells C corresponding to the first resonance frequencies Fr of the surrounded resonators 101-1 to 101-16. In the setting example 170, three or more cells C having different second resonance frequencies Fc are arranged between the cells C having the same second resonance frequency Fc. In the setting example 170, the cells C11, C15, C51, and C55 have the second resonance frequency Fc(1), the cells C21 and C25 have the second resonance frequency Fc(2), the cells C31 and C35 have the second resonance frequency Fc(4), and the cells C41 and C45 have the second resonance frequency Fc(4). In the setting example 170, the cells C12 and C52 have the second resonance frequency Fc (5), the cells C13 and C53 have the second resonance frequency Fc (6), and the cells C14 and C54 have the second resonance frequency Fc (7). Further, in the setting example 170, the cells C22 to C24, C32 to C34, and C42 to C44 have the second resonance frequencies Fc(8) to Fc(16), respectively. The cells C11 to C55 are formed of the resonators 101-1 to 101-16 having the first resonance frequencies Fr(1) to Fr(16) corresponding to the respective second resonance frequencies Fc(1) to Fc(16).

As described above, in the setting example 170, the second resonance frequencies Fc(1) to Fc(16) of the cells C11 to C55 are different in three or less cell spaces CS. Hence, plasma is generated in the cell spaces CS11 to CS55 by the microwaves supplied from the RF power supplies 30 and the antennas 40 corresponding to the cells C11 to C55. In other words, for example, the resonators 101-5, 101-2, and 101-8 forming the adjacent cells C12, C21, and C22 do not resonate with the microwaves supplied from the RF power supply 30 and the antenna 40 corresponding to the cell C11, so that plasma is not generated in these cell spaces. In the cells C15, C51, and C55 having the same second resonance frequency Fc(1) as that of the cell C11, the microwaves are attenuated due to a large distance from the cell C11, so that plasma is not generated. As described above, in Modification 5, the cells C having the same second resonance frequency Fc are set in the cell C where the microwaves leaked from a certain cell C do not reach, so the number of second resonance frequencies Fc can be reduced. In other words, the number of first resonance frequencies Fr of the resonator 101 can be reduced. Further, the frequency range of the output frequency Fo outputted by each RF power supply 30 can be reduced. For example, if the interval between the second resonance frequencies Fc is 0.1 GHz, when the second resonance frequencies Fc are not shared, the frequency range of the output frequency Fo becomes 2.5 GHz wide. On the other hand, when the second resonance frequencies Fc are shared, the frequency range of the output frequency Fo becomes 1.6 GHz wide. The microwaves outputted from the same RF power supply 30 may be branched and supplied to the cells C having the same second resonance frequency Fc.

Figure 19:
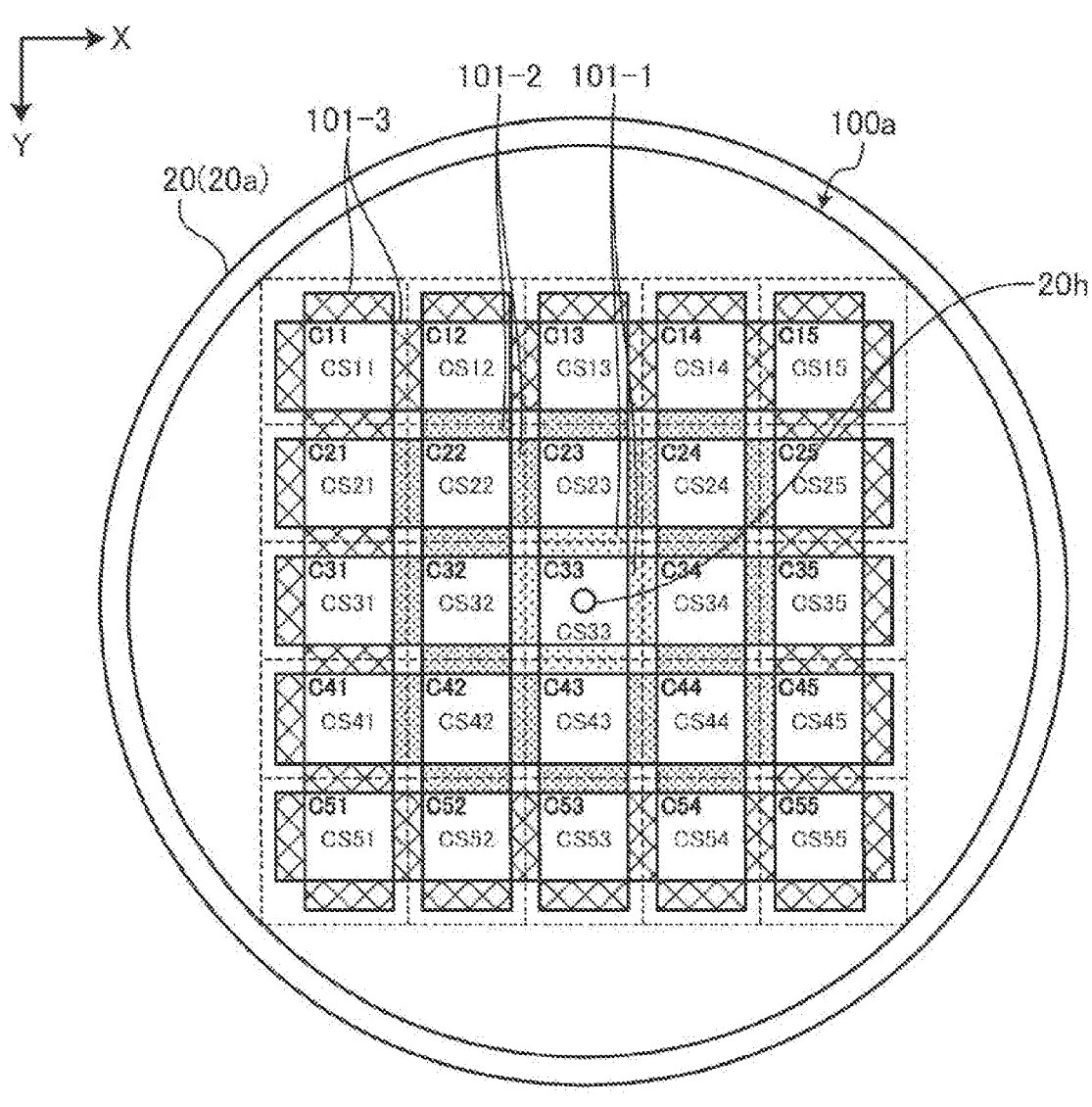
FIG. 19 is a bottom plan view showing an example of a configuration of a dielectric window and a resonator array structure according to Modification 6.

FIG. 19 is a bottom plan view showing an example of a configuration of a dielectric window and a resonator array structure according to Modification 6. A resonator array structure 100a shown in FIG. 19 is different from the resonator array structure 100 of the first embodiment in that a resonator 101 between adjacent cells C is shared, and a plurality of cells C belong to any one of multiple zones. In the resonator array structure 100a, a zone to which the cell C33 belongs, a zone to which the cells C22 to C24, C32, C34, C42 to C44 belong, and a zone to which the cells C11 to C15, C21, C25, C31, C35, C41, C45, C51 to C55 belongs are divided. In other words, in the resonator array structure 100a, three zones, i.e., first to third zones, are provided in a concentric quadrilateral shape from the center. Further, the cells C belonging to the same zone have the same second resonance frequency Fc. In other words, the cell C33 belonging to the first zone has the second resonance frequency Fc(1). The cells C22 to C24, C32, C34, and C42 to C44 belonging to the second zone have the second resonance frequency Fc(2). The cells C11 to C15, C21, C25, C31, C35, C41, C45, and C51 to C55 belonging to the third zone have the second resonance frequency Fc(3).

In this case, for example, the cell C12 is surrounded by four resonators 101, including one resonator 101-2 having the first resonance frequency Fr(2), and three resonators 101-3 having the first resonance frequency Fr(3). As described above, the cell C surrounded by the resonators 101 having different first resonance frequencies Fr has the second resonance frequency Fc corresponding to the first resonance frequency Fr of the largest number of resonators 101. In other words, the cell C12 has the second resonance frequency Fc(3) corresponding to the first resonance frequency Fr(3) of the resonator 101-3. In other words, when the microwaves of the output frequency Fo(3) are supplied to the cell C12, three resonators 101-3 resonate, whereas one resonator 101-2 does not resonate. Further, the second resonance frequency Fc can be determined in other cells C in the same manner.

As described above, in the resonator array structure 100a, the second resonance frequencies Fc(1) to Fc(3) are different in the cells C belonging to the first to third zones provided in a concentric quadrilateral shape. In the cells C11 to C55, plasma is generated by microwaves supplied from the RF power supplies 30 and the antennas 40 corresponding to the cells C11 to C55. In this case, the resonators 101-2 forming the adjacent cells C22 to C24, C32, C34, and C42 to C44 belonging to the second zone do not resonate with the microwaves supplied to the cell C33 belonging to the first zone, so that plasma is not generated in these cell spaces. Further, the resonators 101-1 forming the cell C33 belonging to the first zone do not resonate with the microwaves supplied to the cells C22 to C24, C32, C34, and C42 to C44 belonging to the second zone, so that plasma is not generated in the cell space CS33. Further, the cells C22 to C24, C32, C34, and C42 to C44 belonging to the second zone and the cells C11 to C15, C21, C25, C31, C35, C41, C45, and C51 to C55 belonging to the third zone have the same relationship. In the cell space CS in each zone, when the microwaves are supplied to other cells C in the same zone, the resonator 101 may resonate and plasma may be generated.

As described above, in Modification 6, the second resonance frequency Fc is set for each zone, so that the number of second resonance frequencies Fc can be reduced. In other words, the number of first resonance frequencies Fr of the resonator 101 can be reduced. Further, the frequency range of the output frequency Fo outputted by each RF power supply 30 can be reduced. For example, if the interval between the second resonance frequencies Fc is 0.1 GHz, when the second resonance frequencies Fc are not shared, the frequency range of the output frequency Fo becomes 2.5 GHz wide. On the other hand, when the second resonance frequencies Fc are shared by the zones, the frequency range of the output frequency Fo becomes 0.3 GHz wide. The microwaves output from the same RF power supply 30 may be branched and supplied to the cells C belonging to the same zone, i.e., the cells C having the same second resonance frequency Fc.

Figure 20:
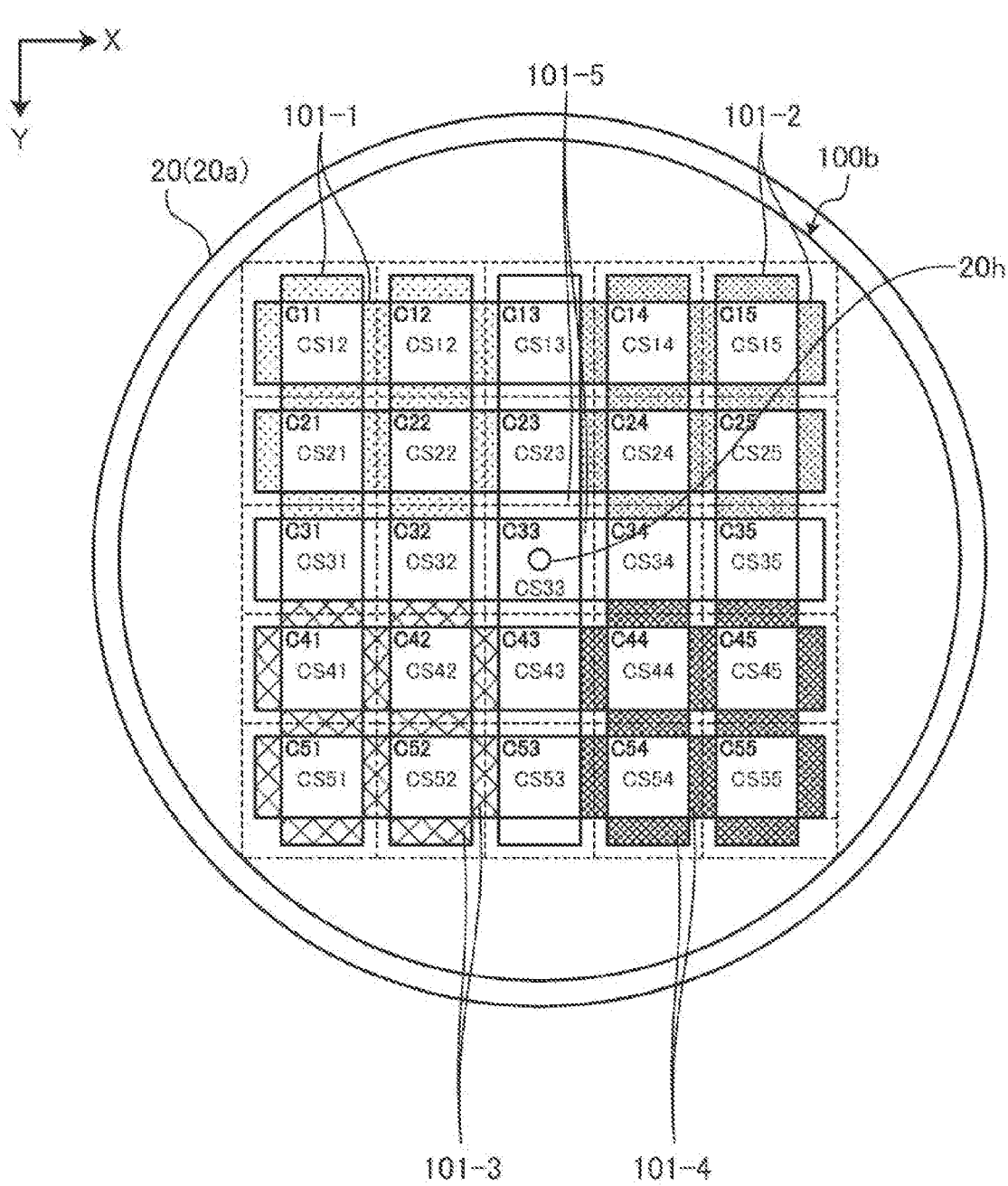
FIG. 20 is a bottom plan view showing an example of a configuration of a dielectric window and a resonator array structure according to Modification 7.

FIG. 20 is a bottom plan view showing an example of a configuration of a dielectric window and a resonator array structure according to Modification 7. A resonator array structure 100b shown in FIG. 20 is different from the resonator array structure 100 of the first embodiment in that the resonator 101 between adjacent cells C is shared1, and a plurality of cells C belong to any one of multiple zones. In the resonator array structure 100b, four zones are divided by the cross-shaped zones to which the cells C13, C23, C31 to C35, C43, and C53 belong. The four zones include a first zone to which the cells C11, C12, C21, and C22 belong, a second zone to which the cells C14, C15, C24, and C25 belong, a third zone to which the cells C41, C42, C51, and C52 belong, and a fourth zone to which the cells C44, C45, C54, and C55 belong. Further, the cross-shaped zone is defined as a fifth zone. In other words, the five zones are provided in the resonator array structure 100b. Further, the cells C belonging to the same zone have the same second resonance frequency Fc. In other words, the cells C11, C12, C21, and C22 belonging to the first zone have the second resonance frequency Fc(1). The cells C14, C15, C24, and C25 belonging to the second zone have the second resonance frequency Fc(2). The cells C41, C42, C51, and C52 belonging to the third zone have the second resonance frequency Fc(3). The cells C44, C45, C54, and C55 belonging to the fourth zone have the second resonance frequency Fc(4). The cells C13, C23, C31 to C35, C43, and C53 belonging to the fifth zone have the second resonance frequency Fc(5).

In this case, for example, the cell C13 is surrounded by four resonators 101 including one resonator 101-1 having the first resonance frequency Fr(1), one resonator 101-2 having the first resonance frequency Fr(2), and two resonators 101-5 having the first resonance frequency Fr(5). As described above, the cell C surrounded by the resonators 101 having different first resonance frequencies Fr has the second resonance frequency Fc corresponding to the first resonance frequency Fr of the largest number of resonators 101. In other words, the cell C13 has the second resonance frequency Fc(5) corresponding to the first resonance frequency Fr(5). In other words, when the microwaves of the output frequency Fo(5) are supplied to the cell C13, two resonators 101-5 resonate, whereas the resonators 101-1 and 101-2 do not resonate. The second resonance frequency Fc can be determined in other cells C in the same manner.

As described above, in the resonator array structure 100b, the second resonance frequencies Fc(1) to Fc(5) are different in the cells C belong to the first to fifth zones arranged in a quadrant shape, such as the first to fourth quadrants and the XY-axes in a two-dimensional coordinate system. In the cells C11 to C55, plasma is generated in the cell space CS11 to CS55 by the microwaves supplied from the RF power supplies 30 and the antennas 40 corresponding to the cells C11 to C55. In this case, the largest number of resonators 101-5 forming the cells C13, C23, and C31 to C33 belonging to the fifth zone do not resonate with the microwaves supplied to the cells C11, C12, C21, and C22 belonging to the first zone adjacent to the fifth zone, so that plasma is not generated in the cell spaces CS13, CS23, CS31 to CS33. Further, the resonators 101-1 forming the cells C11, C12, C21, and C22 belonging to the first zone do not resonate with the microwaves supplied to the cells C13, 23, and C31 to C33 belonging to the fifth zone, so that plasma is not generated in the cell spaces CS11, CS12, CS21, and CS22. The cells C belonging to different zones among the first to fifth zones have the same relationship. Similarly to Modification 6, in the cell space CS in each zone, when the microwaves are supplied to other cells C in the same zone, the resonator 101 may resonate and plasma may be generated.

As described above, in Modification 7, the second resonance frequency Fc is set for each zone, so that the number of second resonance frequencies Fc can be reduced. In other words, the number of first resonance frequencies Fr of the resonator 101 can be reduced. Further, the frequency range of the output frequency Fo outputted by each RF power supply 30 can be reduced. For example, if the interval between the second resonance frequencies Fc is 0.1 GHz, when the second resonance frequencies Fc are not shared, the frequency range of the output frequency Fo becomes 2.5 GHz wide. On the other hand, when the second resonance frequencies Fc are shared by the zones as in Modification 7, the frequency range of the output frequency Fo becomes 0.5 GHz wide. Further, in Modification 7, the plasma density can be independently controlled in each of the 12 o'clock, 3 o'clock, 6 o'clock, and 9 o'clock directions (positive side and negative side of the XY-axes). The microwaves outputted from the same RF power supply 30 may be branched and supplied to the cells C belonging to the same zone, i.e., the cells C having the same second resonance frequency Fc. Further, in the cells C13, C23, C31 to C35, C43, and C53 belonging to the fifth zone, a dielectric plate may be used instead of the resonator 101-5 having the first resonance frequency Fr(5). In this case, four zones including first to fourth zones are provided.

Second Embodiment

In the first embodiment, the plasma processing apparatus 1 having one resonator array structure 100 is used. However, a plasma processing apparatus having a plurality of resonator array structures 100 may be used. The embodiment in that case will be described as a second embodiment.

Figure 21:
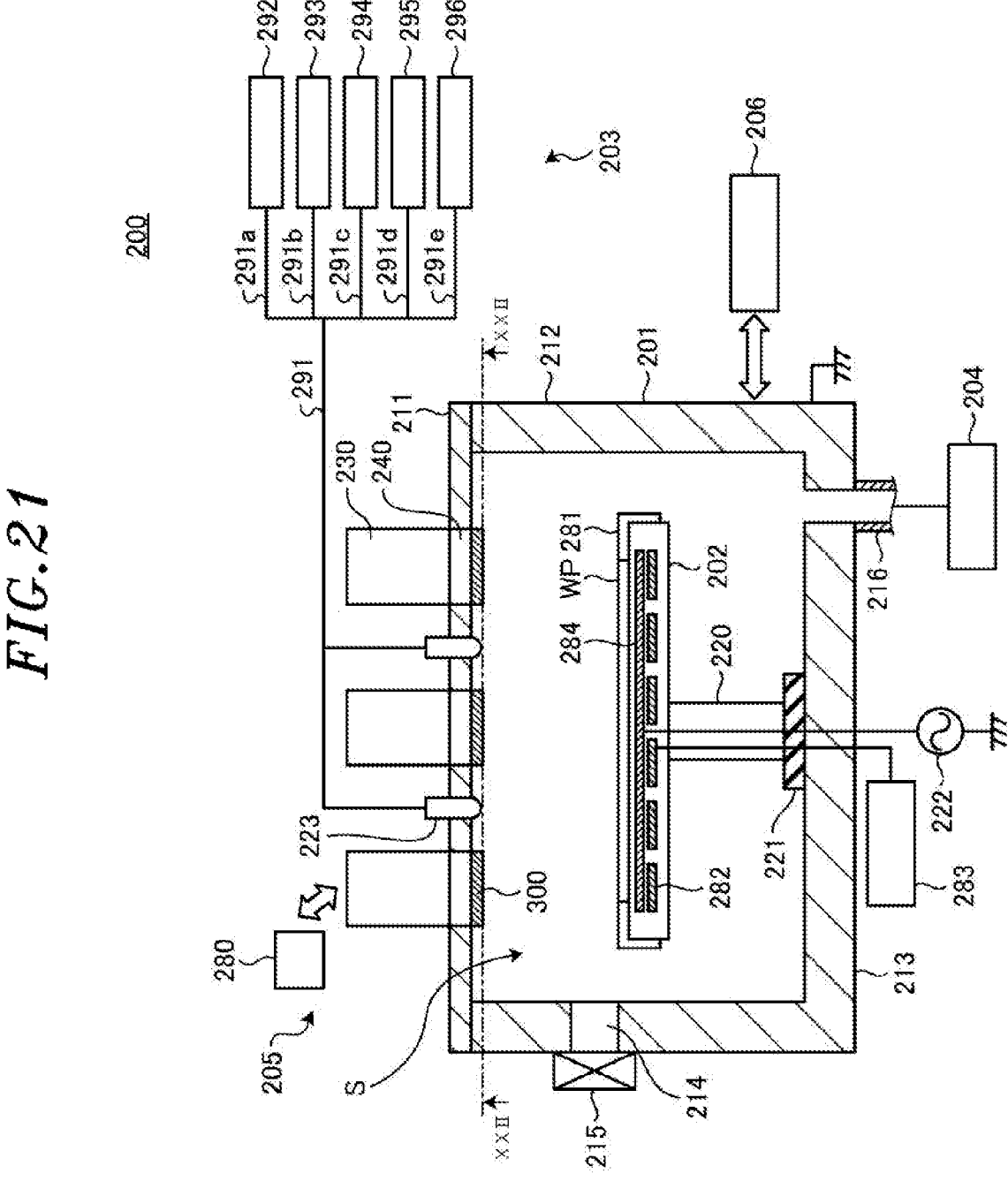
FIG. 21 is a schematic cross-sectional view showing an example of a configuration of a plasma processing apparatus according to a second embodiment.

FIG. 21 is a schematic cross-sectional view showing an example of a configuration of a plasma processing apparatus according to the second embodiment. A plasma processing apparatus 200 shown in FIG. 21 includes a processing chamber 201, a stage 202, a gas supply mechanism 203, an exhaust device 204, a microwave output device 205, and a controller 206. The processing chamber 201 accommodates the object to be processed WP. The stage 202 places the object WP to be processed thereon. The gas supply mechanism 203 supplies a gas into the processing chamber 201. The exhaust device 204 exhausts the processing chamber 201. The microwave output device 205 generates microwaves for generating plasma in the processing chamber 201 and introduces the microwaves into the processing chamber 201. The controller 206 controls operations of individual components of the plasma processing apparatus 200.

The processing chamber 201 is made of a metal such as aluminum or an alloy thereof, and has the substantially cylindrical processing space S therein. The processing chamber 201 has a plate-shaped ceiling wall 211, a plate-shaped bottom wall 213, and a sidewall part 212 that connects them. The microwave output device 205 is disposed at an upper part of the processing chamber 201 and functions as a plasma generation part for introducing electromagnetic waves (microwaves) into the processing chamber 201 to generate plasma. The microwave output device 205 includes a plurality of RF power supplies 230 and a host controller 280, similar to the microwave output device 16 of the first embodiment. The plurality of RF power supplies 230 are provided to correspond to a plurality of resonator array structures 300 to be described later. Further, the plurality of RF power supplies 230 are respectively connected to the plurality of antennas 240. The functional configurations of the RF power supplies 230, the antennas 240, and the host controller 280 are the same as those of the RF power supplies 30, the antennas 40, and the host controller 80 of the first embodiment, so that the description thereof will be omitted.

The ceiling wall 211 has a plurality of openings into which the RF power supplies 230 of the microwave output device 205, the antennas 240, the resonator array structure to be described later, and a gas introducing part are fitted. The sidewall 212 has a loading/unloading port 214 for loading/unloading the object to be processed WP to/from a transfer chamber (not shown) adjacent to the processing chamber 201. The loading/unloading port 214 is opened and closed by a gate valve 215. An exhaust device 204 is disposed at the bottom wall 213. The exhaust device 204 is disposed in an exhaust line 216 connected to the bottom wall 213, and includes a vacuum pump and a pressure control valve. The processing chamber 201 is exhausted through the exhaust line 216 by the vacuum pump of the exhaust device 204. A pressure in the processing chamber 201 is controlled by the pressure control valve.

The stage 202 has a disc shape and is made of ceramic such as AlN. The stage 202 is supported by a cylindrical support member 220 made of ceramic such as AlN and extending upward from the center of the bottom portion of the processing chamber 201. A guide ring 281 for guiding the object to be processed WP is disposed at the outer edge of the stage 202. Inside the stage 202, a lift pin (not shown) for raising and lowering the object to be processed WP is provided to protrude beyond and retract from the upper surface of the stage 202. Further, a resistance heater 282 is embedded in the stage 202 to heat the object to be processed WP via the stage 202 by the power from a heater power supply 283. A thermocouple (not shown) is embedded in the stage 202, so that the heating temperature of the object to be processed WP can be adjusted to a predetermined temperature within a range of 300° C. to 1000° C., for example, based on a signal from the thermocouple. An electrode 284 having the same size as that of the object to be processed WP is buried in the stage 202 to be positioned above the heater 282, and an RF bias power supply 222 is electrically connected to the electrode 284. An RF bias power for attracting ions to the stage 202 is applied from the RF bias power supply 222 to the electrode 284. The RF bias power supply 222 may not be provided depending on characteristics of plasma processing.

The gas supply mechanism 203 introduces, into the processing chamber 201, a plasma generation gas and a source gas for forming a film such as a carbon film, and has a plurality of gas inlet nozzles 223. The gas introduction nozzle 223 is fitted into an opening formed in the ceiling wall 211 of the processing chamber 201. A gas supply line 291 is connected to the gas inlet nozzle 223. The gas supply line 291 branches into five branch lines 291a, 291b, 291c, 291d, and 291e. An Ar gas supply source 292, an $O_2$ gas supply source 293, a $N_2$ gas supply source 294, an $H_2$ gas supply source 295, and a $C_2H_2$ gas supply source 296 are connected to the branch lines 291a, 291b, 291c, 291d, and 291e. The Ar gas supply source 292 supplies Ar gas as a noble gas that is a plasma generation gas. The $O_2$ gas supply source 293 supplies $O_2$ gas as an oxidizing gas that is a cleaning gas. The $N_2$ gas supply source 294 supplies $N_2$ gas used as a purge gas or the like. The $H_2$ gas supply source 295 supplies $H_2$ gas as a reducing gas. The $C_2H_2$ gas supply source 296 supplies acetylene ($C_2H_2$) gas as a carbon-containing gas that is a film forming source gas. The $C_2H_2$ gas supply source 296 may supply another carbon-containing gas such as ethylene ($C_2H_4$) or the like.

Although it is not illustrated, the branch lines 291*a*, 291*b*, 291*c*, 291*d*, and 291*e* are provided with a mass flow controller for flow rate control and valves disposed at both sides thereof. The dissociation of gases can be adjusted by providing a shower plate and supplying $C_2H_2$ gas and $H_2$ gas to a position close to the object to be processed WP. Further, the same effect can be obtained by extending the nozzles for supplying these gases downward.

As described above, the microwave output device 205 is disposed above the processing chamber 201, and functions as a plasma generation part that introduces electromagnetic waves (microwaves) into the processing chamber 201 to generate plasma.

Figure 22:
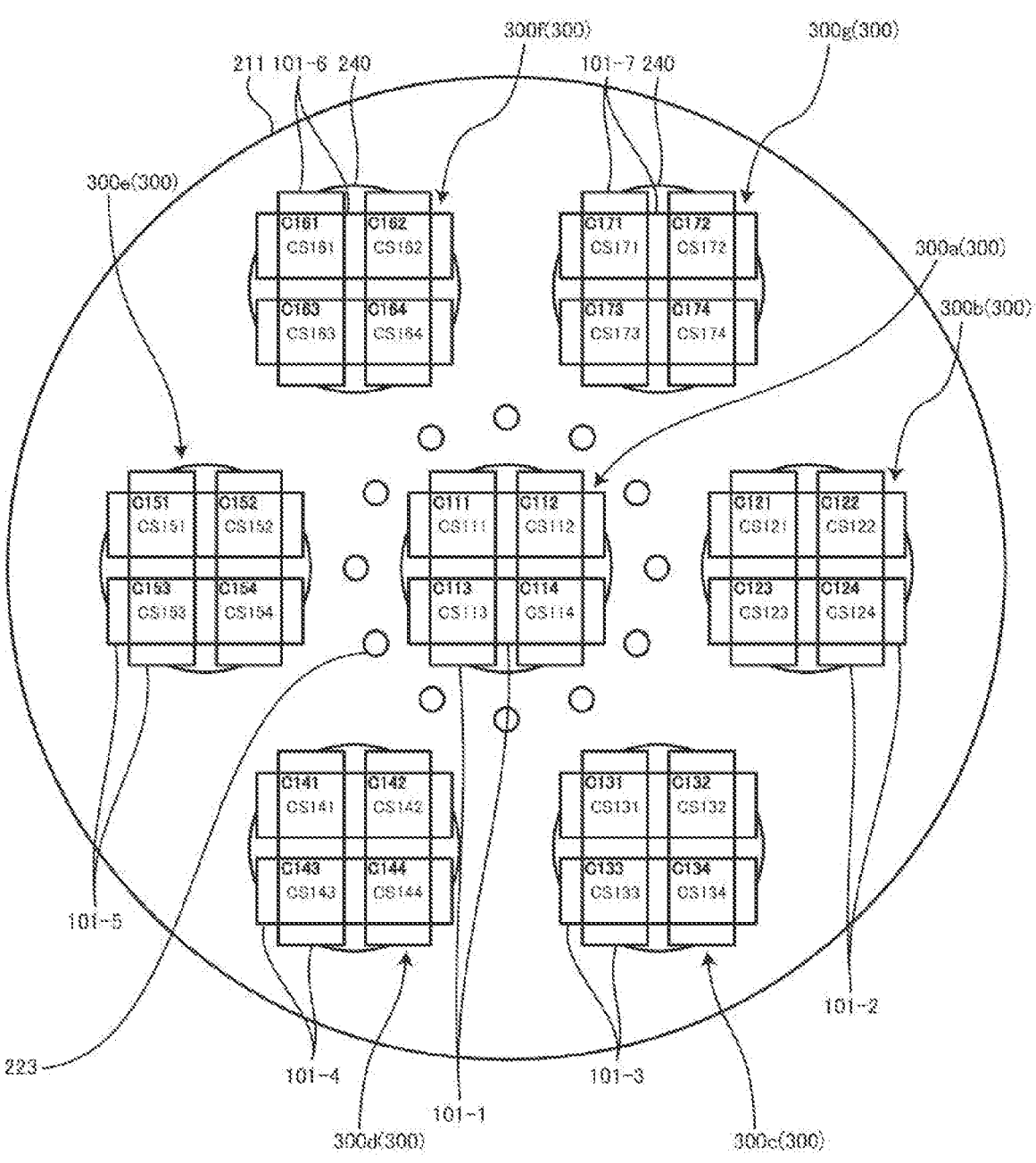
FIG. 22 is a bottom plan view showing an example of a configuration of a dielectric window and a resonator array structure according to the second embodiment.

FIG. 22 is a bottom plan view showing an example of the configuration of the dielectric window and the resonator array structure according to the second embodiment. FIG. 22 shows a portion of the processing space S that is located inner than the sidewall 212 in the XXII-XXII cross section of FIG. 21. In the second embodiment, seven RF power supplies 230 are provided, and the antennas 240 corresponding thereto are evenly arranged in a hexagonal close-packed arrangement as shown in FIG. 22. In other words, one of the seven antennas 240 is disposed at the center of the ceiling wall 211, and the other six antennas 240 are arranged therearound. The antenna 240 has a microwave transmission plate made of a dielectric material on the processing space S side. The seven antennas 240 are arranged to be spaced apart from each other at regular intervals. The plurality of gas inlet nozzles 223 of the gas supply mechanism 203 are arranged to surround the central antenna 240. The number of RF power supplies 230 and the number of antennas 240 are not limited to seven.

The resonator array structures 300 are disposed on the bottom surface of the antenna 240, i.e., at positions corresponding to the plurality of RF power supplies 230 and the plurality of antennas 240 on the ceiling wall 211. The resonator array structure 300 is formed by arranging a plurality of resonators that can resonate with the magnetic field components of the microwaves and having a size smaller than the wavelength of the microwave. The resonator array structures 300 are disposed in the processing chamber 201. The bottom surface of the antenna 240 may be in contact with the resonator array structure 300 or may be separated from the resonator array structure 300.

Each resonator array structure 300 has a plurality of cells C, each including a plurality of resonators 101, similarly to the resonator array structure 100 of the first embodiment. Four cells C111 to C114 are formed in a resonator array structure 300*a* corresponding to the antenna 240 disposed at the center of the ceiling wall 211. The cells C111 to C114 are surrounded by the resonator 101-1, and the resonator 101-1 between adjacent cells C is shared. For example, the resonator 101-1 is shared between the cell C111 and the cell C112. Plasma is generated in each of the cell spaces CS111 to CS114.

Resonator array structures 300*b* to 300*g* are disposed at positions corresponding to the antennas 240 arranged around the central antenna 240. Four cells C121 to C124 are formed in the resonator array structure 300*b*. The cells C121 to C124 are surrounded by the resonator 101-2, and the resonator 101-2 between adjacent cells C is shared. For example, the resonator 101-2 is shared between the cell C121 and the cell C122. Plasma is generated in each of the cell spaces CS121 to CS124.

Four cells C131 to C134 are formed in the resonator array structure 300*c*. The cells C131 to C134 are surrounded by the resonator 101-3, and the resonator 101-3 between adjacent cells C is shared. For example, the resonator 101-3 is shared between the cell C131 and the cell C132. Plasma is generated in each of the cell spaces CS131 to CS134.

Four cells C141 to C144 are formed in the resonator array structure 300*d*. The cells C141 to C144 are surrounded by the resonator 101-4, and the resonator 101-4 between adjacent cells C is shared. For example, the resonator 101-4 is shared between the cell C141 and the cell C142. Plasma is generated in each of the cell spaces CS141 to CS144.

Four cells C151 to C154 are formed in the resonator array structure 300*e*. The cells C151 to C154 are surrounded by the resonator 101-5, and the resonator 101-5 between adjacent cells C is shared. For example, the resonator 101-5 is shared between the cell C151 and the cell C152. Plasma is generated in each of the cell spaces CS151 to CS154.

Four cells C161 to C164 are formed in the resonator array structure 300*f*. The cells C161 to C164 are surrounded by the resonator 101-6, and the resonator 101-6 between adjacent cells C is shared. For example, the resonator 101-6 is shared between the cell C161 and the cell C162. Plasma is generated in each of the cell spaces CS161 to CS164.

Four cells C171 to C174 are formed in the resonator array structure 300*g*. The cells C171 to C174 are surrounded by the resonator 101-7, and the resonator 101-7 between adjacent cells C is shared. For example, the resonator 101-7 is shared between the cell C171 and the cell C172. Plasma is generated in each of the cell spaces CS171 to CS174.

In the resonator array structures 300*a* to 300*g*, the first resonance frequencies Fr of the resonators 101 are different, so that the second resonance frequencies Fc as the cells C are also different. In other words, the cells C111 to C114 of the resonator array structure 300*a* have the second resonance frequency Fc(1). Similarly, the cells C121 to C124 of the resonator array structure 300*b* have the second resonance frequency Fc(2). The cells C131 to C134 of the resonator array structure 300*c* have the second resonance frequency Fc(3). The cells C141 to C144 of the resonator array structure 300*d* have the second resonance frequency Fc(4). The cells C151 to C154 of the resonator array structure 300*e* have the second resonance frequency Fc(5). The cells C161 to C164 of the resonator array structure 300*f* have the second resonance frequency Fc(6). The cells C171 to C174 of the resonator array structure 300*g* have the second resonance frequency Fc(7). In other words, in the resonator array structures 300*a* to 300*g*, the resonator array structure 100 of the first embodiment is divided into zones.

As described above, in the second embodiment, the second resonance frequencies Fc of the cells C of the resonator array structures 300*a* to 300*g* are different from each other. Therefore, for example, even if microwaves are supplied from the RF power supply 230 and the antenna 240 corresponding to the resonator array structure 300*a*, plasma is not generated in the adjacent resonator array structures 300*b* to 300*g*. In other words, in the second embodiment, the plasma distribution and the plasma density can be controlled for each resonator array structure 300.

In the second embodiment, in the case of the resonator array structure 300*a*, for example, one RF power supply 230 and one antenna 240 correspond to the cells C111 to C114. However, the RF Power supply 230 and the antenna 240 may be provided for each of the cells C111 to C113. For example, the resonator 101-1 may not be shared between adjacent cells C111 to C114, but may be provided separately.

Third Embodiment

In the first embodiment, the RF power supply 30 and the antenna 40 are provided for each cell C of the resonator array structure 100. However, one RF power supply and one microwave introducing part may be provided for the entire resonator array structure 100. An embodiment in this case will be described as a third embodiment. Since the plasma processing apparatus of the third embodiment is the same as that of the first embodiment except the RF power supply and the microwave introducing part, the description of redundant components and operations will be omitted.

Figure 23:
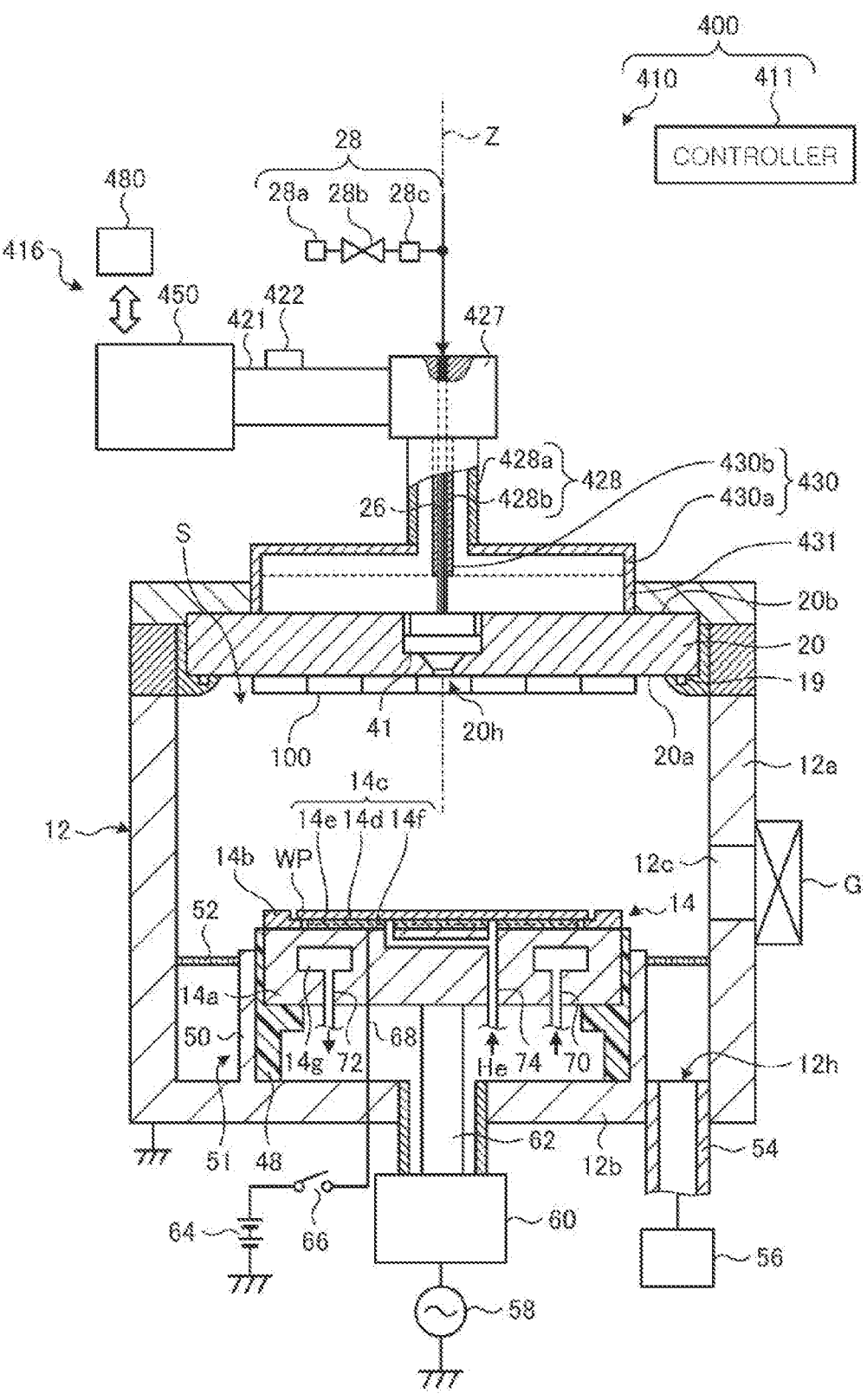
FIG. 23 is a schematic cross-sectional view showing an example of a configuration of a plasma processing apparatus according to a third embodiment.

FIG. 23 is a schematic cross-sectional view showing an example of a configuration of a plasma processing apparatus according to the third embodiment. As shown in FIG. 23, a plasma processing apparatus 400 of the third embodiment includes an apparatus main body 410 and a controller 411 instead of the apparatus main body 10 and controller 11 of the first embodiment. Further, the apparatus main body 410 includes a microwave output device 416 instead of the microwave output device 16 of the first embodiment. Further, the apparatus main body 410 includes a coaxial waveguide 430 and a cylindrical waveguide 431 as a microwave introducing part.

The microwave output device 416 includes an RF power supply 450 and a host controller 480. The RF power supply 450 outputs microwaves for exciting the processing gas supplied into the processing chamber 12.

The apparatus main body 410 includes a waveguide 421, a waveguide coaxial converter 427, and a coaxial waveguide 428. An output part of the RF power supply 450 is connected to one end of the waveguide 421. The other end of the waveguide 421 is connected to the waveguide coaxial converter 427. The waveguide 421 is, e.g., a rectangular waveguide. The waveguide 421 includes a matching device 422. By adjusting the matching device 422, the impedance of the RF power supply 450 and the impedance of the load can be matched. Further, the matching device 422 (the matching device disposed at the rear end of the output of the RF power supply 450) may be omitted.

The coaxial waveguide 428 includes an outer conductor 428a and an inner conductor 428b. The outer conductor 428a and the inner conductor 428b have a substantially cylindrical shape. The outer conductor 428a and the inner conductor 428b are connected to the upper part of the coaxial waveguide 430, which is a microwave introducing part, such that the center axes of the outer conductor 428a and the inner conductor 428b substantially coincide with the Z-axis. The microwaves outputted from the microwave output device 416 are transmitted in the waveguide 421 in a TE10 mode. The transmission mode of the microwaves transmitted through the waveguide 421 is converted by the waveguide coaxial converter 427, and the microwaves are transmitted through the coaxial waveguide 428 in a TEM mode.

The coaxial waveguide 430 includes an outer conductor 430a and an inner conductor 430b. The outer conductor 430a and the inner conductor 430b have a substantially cylindrical shape. The outer conductor 430a and the inner conductor 430b are connected to the coaxial waveguide 428 such that the center axes of the outer conductor 430a and the inner conductor 430b substantially coincide with the Z-axis. In other words, in the coaxial waveguide 430, the outer conductor 430a connected to the outer conductor 428a of the coaxial waveguide 428 has a diameter similar to the diameter of the stage 14 opposed thereto.

The cylindrical waveguide 431 has a substantially cylindrical shape. The cylindrical waveguide 431 is connected to the outer conductor 430a of the coaxial waveguide 430 such that the central axis thereof substantially coincides with the Z-axis. In other words, the cylindrical waveguide 431 is the same as the coaxial waveguide 430 without the inner conductor 430b. The inner diameter of the cylindrical waveguide 431 is greater than the inner diameter of the outer conductor 428a of the coaxial waveguide 428.

Here, the microwave introducing part (the coaxial waveguide 430 and the cylindrical waveguide 431) will be described with reference to FIGS. 24 and 25.

Figure 24:
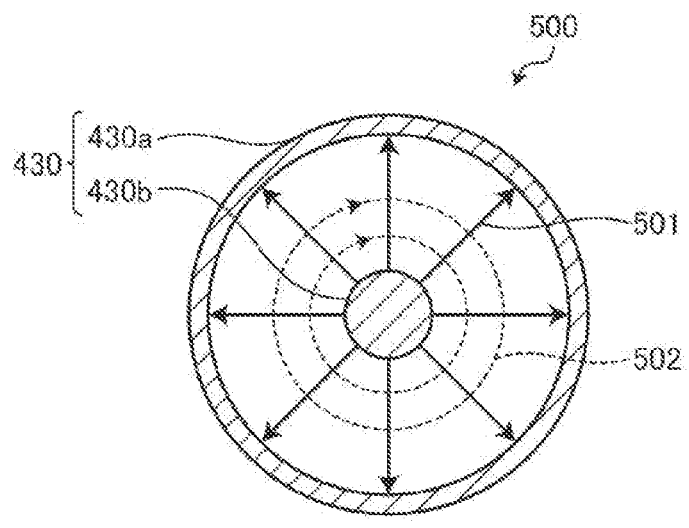
FIG. 24 is a cross-sectional view showing an example of a coaxial waveguide according to a third embodiment.

FIG. 24 is a cross-sectional view showing an example of a coaxial waveguide according to the third embodiment. A cross section 500 shown in FIG. 24 illustrates electric field 501 and magnetic field 502 in a horizontal cross section of the coaxial waveguide 430. The electric field 501 is directed from the inner conductor 430b toward the outer conductor 430a. On the other hand, the magnetic field 502 rotates around the inner conductor 430b. In other words, in the coaxial waveguide 430, the microwaves are transmitted in the TEM mode.

Figure 25:
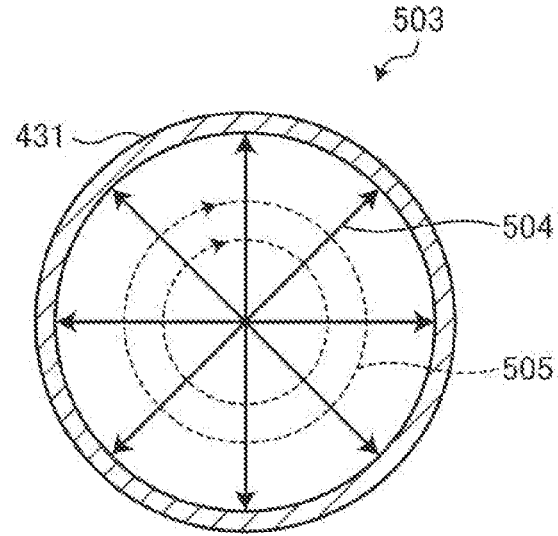
FIG. 25 is a cross-sectional view showing an example of a cylindrical waveguide according to the third embodiment.

FIG. 25 is a cross-sectional view showing an example of a cylindrical waveguide according to the third embodiment. A cross section 503 shown in FIG. illustrates electric field 504 and magnetic field 505 in a horizontal cross section of the cylindrical waveguide 431. The electric field 504 is directed from the center of the cylindrical waveguide 431 toward the cylindrical waveguide 431. On the other hand, the magnetic field 505 rotates around the center of the cylindrical waveguide 431. In other words, in the cylindrical waveguide 431, the microwaves are affected by the TEM mode of the coaxial waveguide 430 and transmitted in the TM01 mode. In other words, in the third embodiment, the microwave introducing mode is the TM01 mode, and the resonator 101 of the resonator array structure 100 is resonated using the rotating magnetic field. The microwave introducing mode is not limited to the TM01 mode, and may be another mode. Further, the microwave introducing part may be any introducing part, such as a monopole antenna or a multipole antenna, as long as it can introduce microwaves into the processing chamber 12.

The RF power supply 450 generates an RF power (microwaves) for plasma generation using waveform data including a set frequency component having a predetermined frequency range. For example, the RF power supply 450 uses the waveform data including the set frequency component having a signal component of 2.45 GHz that is a set value, and signal components of any multiple frequencies within a range of ±25% of the set value to generate microwaves centered at 2.45 GHz. The RF power supply 450 receives the power setting Pset of the RF power and the waveform setting (waveform data) that is the information such as the set frequency and the like from the host controller 480 to be described later. Further, the microwaves outputted from the RF power supply 450 are supplied to the cylindrical waveguide 431 via the waveguide 421, the waveguide coaxial converter 427, the coaxial waveguide 428, and the coaxial waveguide 430.

The host controller 480 controls the RF power supply 450 in response to the instruction from the controller 411. The host controller 480 outputs the microwave power setting Pset and the waveform setting to the RF power supply 450 based on the recipe inputted from the controller 411. The waveform setting is, e.g., the waveform data for setting the center frequency and the waveform shape the microwaves. Further, the monitor values Pf mon and Pr mon from the RF power supply 450 are inputted to the host controller 480. The host controller 480 outputs the input monitor values Pf mon and Pr mon to the controller 411. The host controller 480 may be included in the controller 411.

Figure 26:
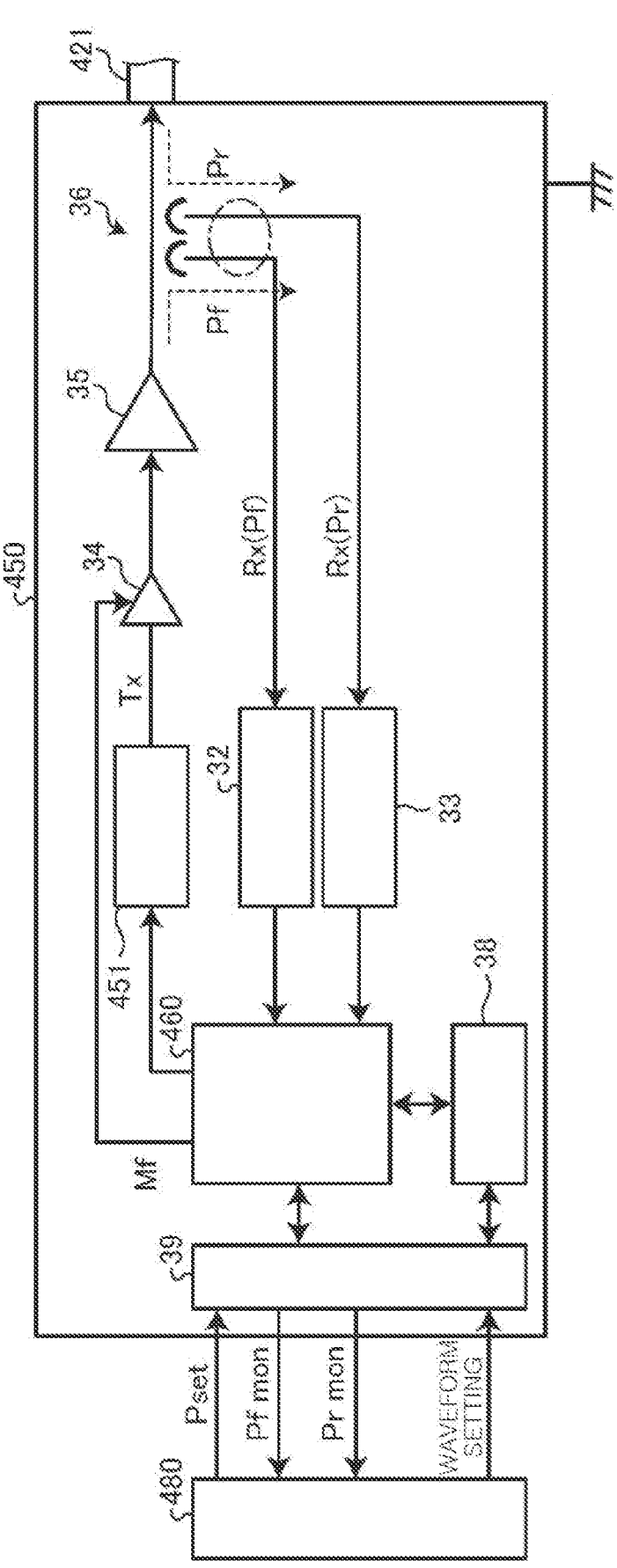
FIG. 26 is a block diagram showing an example of a functional configuration of an RF power supply according to the third embodiment.
Figure 27:
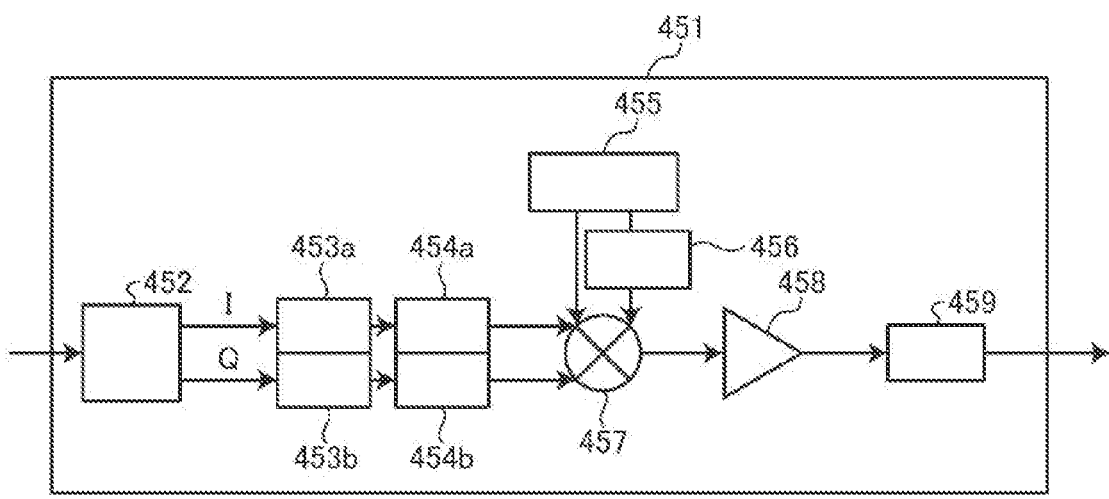
FIG. 27 is a block diagram showing an example of a functional configuration of a modulator according to the third embodiment.

Next, the functional configuration of the RF power supply 450 will be described with reference to FIGS. 26 and 27. FIG. 26 is a block diagram showing an example of the functional configuration of the RF power supply according to the third embodiment. As shown in FIG. 26, the RF power supply 450 includes a modulator 451 and an operation part 460 instead of the VF converter 31 and the operation part 37 of the RF power supply 30 of the first embodiment. Further, the RF power supply 450 outputs microwaves to the waveguide 421.

The modulator 451 generates modulated microwaves (RF signal) based on the waveform data inputted from the operation part 460. In other words, the modulator 451 generates broadband waveform (multitone) microwaves. Here, the modulator 451 will be described with reference to FIG. 27. FIG. 27 is a block diagram showing an example of a functional configuration of a modulator according to the third embodiment. As shown in FIG. 27, the modulator 451 includes an inverse Fourier transformer 452, digital/analog (D/A) converters 453a and 453b, low pass filters (LPF) 454a and 454b, a phase locked loop (PLL) oscillator 455, a phase shifter 456, a multiplier 457, an amplifier 458, and a band pass filter (BPF) 459.

The inverse Fourier transformer 452 performs inverse Fourier transform on the waveform data inputted from the operation part 460, thereby separating the in-phase component (I data) and the quadrature component (Q data) of the waveform data. The I data and the Q data of the waveform data, which are separated by the inverse Fourier transformer 452, are D/A converted by the D/A converters 453a and 453b, and inputted to the multiplier 457 via the LPFs 454a and 454b.

The PLL oscillator 455 generates a reference carrier and outputs the generated reference carrier to the phase shifter 456 and the multiplier 457. The phase shifter 456 shifts the phase of the reference carrier inputted from the PLL oscillator 455 by 90°, and outputs the reference carrier whose phase has been shifted by 90° to the multiplier 457. The multiplier 457 multiplies the I data inputted from the LPF 454a and the reference carrier inputted from the PLL oscillator 455. The multiplier 457 multiplies the Q data inputted from the LPF 454b and the reference carrier inputted from the phase shifter 456. The multiplication results of the multiplier 457 are combined by an adder (not shown) to generate microwaves for plasma generation. The generated microwaves are amplified by the amplifier 458 and outputted to the pre-amplifier 34 via the BPF 459.

Referring back to FIG. 26, the operation part 460 is a controller that controls the RF power supply 450. The microwave power setting Pset and the waveform setting (waveform data) such as the information on the set frequency are inputted from the host controller 480 to the operation part 460 via the input/output part 39. The operation part 460 executes the process of calculating the traveling wave power Pf, the process of calculating the reflected wave power Pr, and the setting of the power command value Mf. The operation part 460 outputs the waveform data based on the waveform setting to the modulator 451 and outputs the power command value Mf to the pre-amplifier 34. The power command value Mf is controlled by so-called load control (constant power control). Further, the operation part 460 outputs the monitor value Pf mon of the traveling wave power Pf and the monitor value Pr mon of the reflected wave power Pr to the upper controller 480.

Figure 28:
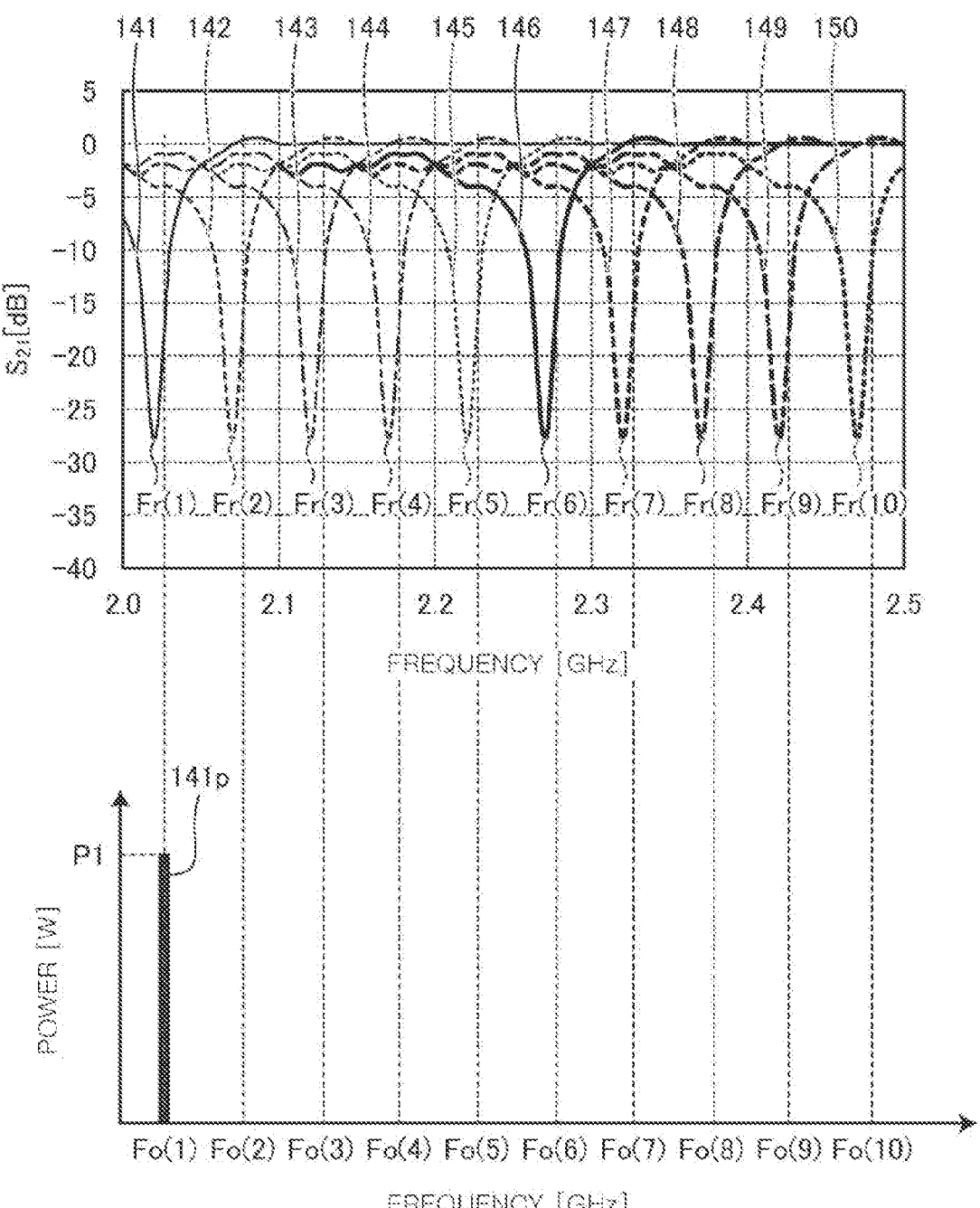
FIG. 28 shows an example of setting of resonance frequencies of resonators and an output of an RF power supply according to the third embodiment.
Figure 29:
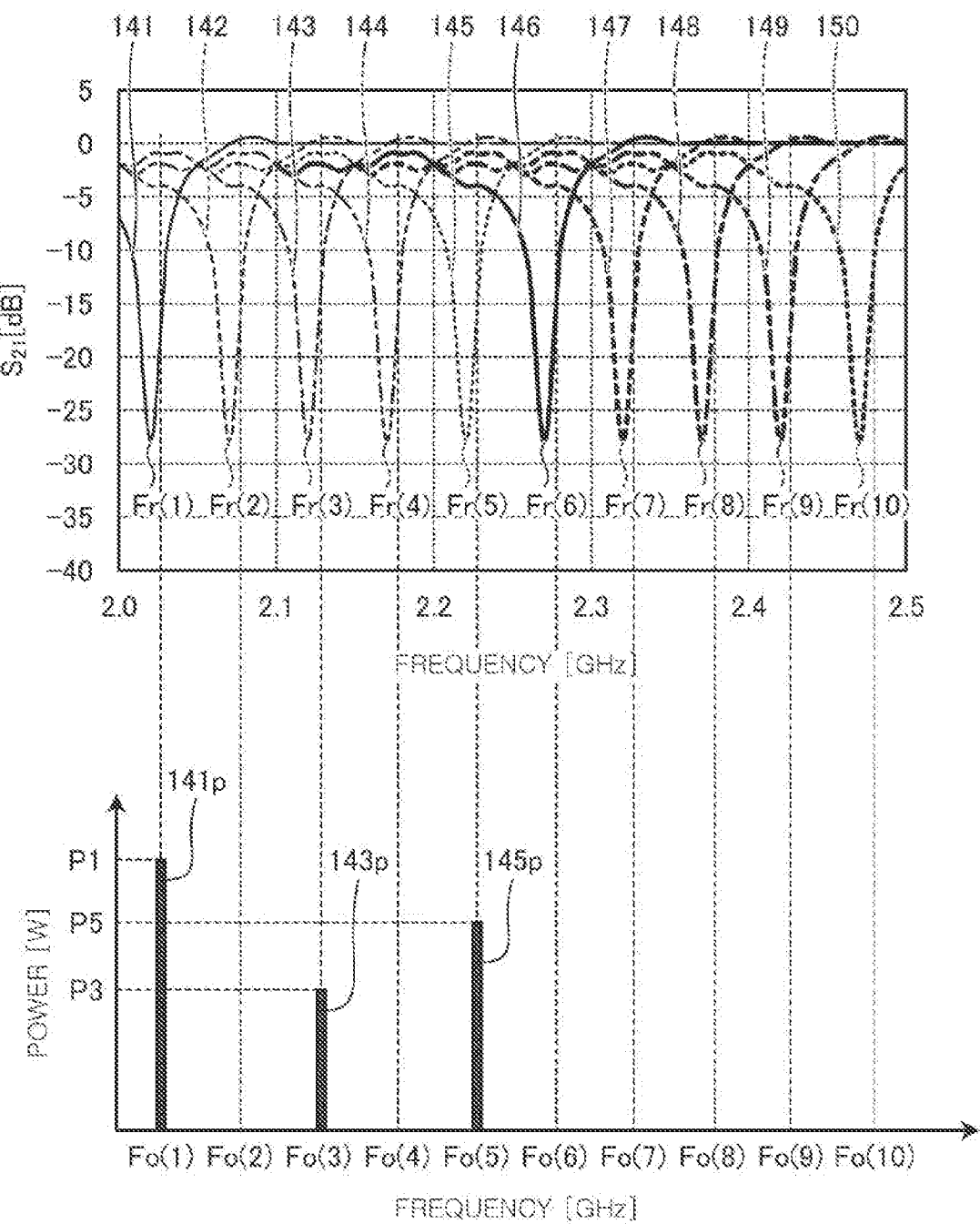
FIG. 29 shows an example of setting of the resonance frequencies of the resonators and the output of the RF power supply according to the third embodiment.

Next, the setting of the first resonance frequency Fr of the resonator 101 and the output of the RF power supply 450 will be described with reference to FIGS. 28 and 29. FIGS. 28 and 29 show examples of setting of the resonance frequency of the resonator and the output of the RF power supply according to the third embodiment. As shown in FIGS. 28 and 29, the plurality of resonators 101 have different first resonance frequencies Fr(1) to Fr(10) expressed by graphs 141 to 150 within a range of 2.0 GHz to 2.5 GHz, for example. Here, when the waveform setting in which the power setting Pset of the output frequency Fo(1) is P1 is inputted from the host controller 480, the RF power supply 450 outputs microwaves shown in a graph 141p of FIG. 28. In this case, for example, as shown in FIG. 13 of the first embodiment, when the second resonance frequencies Fc of the cells C11 to C55 are set to the second resonance frequencies Fc(1) to Fc(25), plasma is generated in the cell C11 having the second resonance frequency Fc(1). On the other hand, in the other cells C12 to C55, plasma is not generated because they do not resonate with the microwaves of the second resonance frequency Fc(1).

Next, the case in which the waveform setting in which the power settings Pset of the output frequencies Fo(1), Fo(3), and Fo(5) are P1, P3, and P5 is inputted from the host controller 480 to the RF power supply 450 will be described. In this case, the RF power supply 450 outputs multitone microwaves expressed by graphs 141p, 143p, and 145p of FIG. 29. In this case, for example, if the second resonance frequencies Fc of the cells C11 to C55 are set to the second resonance frequency Fc(1) to Fc(25) as described above, plasma is generated in the cells C11, C13, and C15 having the second resonance frequencies Fc(1), Fc(3), and Fc(5). On the other hand, in the other cells C12, C14, and C21 to C55, plasma is not generated because they do not resonate with the second resonance frequencies Fc(1), Fc(3), and Fc(5). As described above, in the third embodiment, by performing the power setting depending on the second resonance frequency Fc of the cell C, the microwave power supplied to a certain cell C can be set. For example, when the second frequencies Fc of the cells C11 to C55 are set to the second resonance frequencies Fc(1) to Fc(25) as described above, the plasma distribution and the plasma density in each of the cells C11 to C55 can be controlled by performing the power settings Pset of the output frequencies Fo(1) to Fo(25). In other words, in the third embodiment, plasma can be selectively generated in the cells C11 to C55 to control the plasma distribution and the plasma density. Further, since the apparatus main body 410 of the third embodiment includes the coaxial waveguide 430 and the cylindrical waveguide 431 as the microwave introducing part, a simpler structure can be achieved compared to the apparatus main body 10 of the first embodiment. The third embodiment may be combined with the first and second embodiments and Modifications 1 to 7.

(Plasma Control Method)

Figure 30:
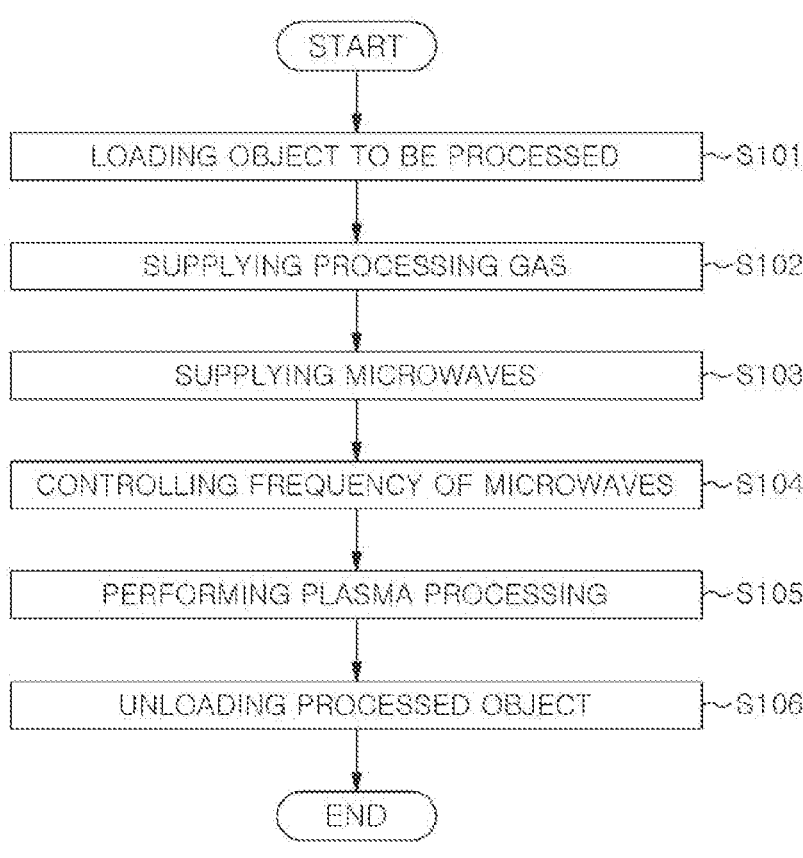
FIG. 30 is a flowchart showing an example of plasma control processing according to the third embodiment.

Next, an example of a plasma control process using the plasma processing apparatus 400 according to the third embodiment will be described. FIG. 30 is a flowchart showing an example of the plasma control process according to the third embodiment. The plasma control process shown in FIG. 30 is realized by controlling individual components of the apparatus main body 410 by the controller 411.

First, the object to be processed WP is loaded into the processing chamber 12 and placed on the electrostatic chuck 14C (step S101). Then, the controller 411 opens the valve 28b, and controls the flow rate controller 28c such that the processing gas is supplied at a predetermined flow rate into the processing chamber 12 (step S102). Then, the controller 411 controls the exhaust device 56 to adjust a pressure in the processing chamber 12.

Next, the controller 411 controls the microwave output device 416 to supply microwaves from the cylindrical waveguide 431 to the processing space S in the processing chamber 12 (step S103). Accordingly, plasma of the processing gas is generated in the processing chamber 12. In this case, it is assumed that the electron density of the plasma reaches the cutoff density. When the electron density of the plasma reaches the cutoff density, the microwaves cannot propagate in the processing space S in the processing chamber 12.

Therefore, the controller 411 controls the microwave output device 416 to control the frequency having multiple frequency components included in the broadband microwaves supplied from the cylindrical waveguide 431 to the processing space S in the processing chamber 12 to a target frequency band (the output frequency Fo) (step S104). In other words, the controller 411 controls the microwave output device 416 to supply the microwaves (broadband microwaves) containing multiple frequency components belonging to a predetermined frequency bandwidth from the cylindrical waveguide 431 into the processing space S in the processing chamber 12. In other words, the controller 411 controls the microwave output device 416 such that the microwaves including the plurality of output frequencies Fo capable of resonating with the plurality of second resonance frequencies Fc as the cells C corresponding to the plurality of first resonance frequencies Fr can be supplied to the processing space S. Accordingly, the resonance between the microwaves and the plurality of resonators 101 occur, so that both the dielectric constant and the magnetic permeability of the plasma in the processing space S can become negative, and the microwaves can propagate in the processing space S as can be seen from the above Eq. (1). Hence, in the processing space S in the processing chamber 12, the microwaves can propagate beyond the skin depth of the plasma, and the microwave power can be efficiently absorbed by the plasma. As a result, the high-density plasma can be generated over a wide area beyond the skip depth of the plasma.

Then, plasma processing is performed on the object to be processed WP using the plasma generated in the processing space S in the processing chamber 12 (step S105).

When the plasma processing is completed, the processed object WP is unloaded from the processing chamber 12 by a robot arm (not shown) (step S106).

In accordance with the above embodiments, the plasma processing apparatuses 1, 200, and 400 include the processing chambers 12 and 201, each having the processing space S, the electromagnetic wave generators (the microwave output devices 16, 205, and 416) configured to generate electromagnetic waves for plasma excitation to be supplied to the processing space S, the dielectric (the dielectric window 20) having the first surface facing the processing space S, the electromagnetic wave supply parts (the antennas 40 and 240) configured to supply the electromagnetic waves into the processing space S via the dielectric, the cylindrical waveguide 431, and the resonator array structures 100, 100a, 100b, and 300 disposed along the first surface of the dielectric in the processing chamber. The resonator array structure includes the plurality of resonators 101 capable of resonating with magnetic field components of the electromagnetic waves and having a size smaller than the wavelength of the electromagnetic wave, i.e., the resonator 101B having the first resonance frequency Fr and including a structure in which the conductor member (the ring member 111B) is laminated on one surface of the dielectric plate 112B, and is configured to form a plurality of cells C surrounded by the plurality of resonators 101. The plurality of cells C include the resonators 101 having different first resonance frequencies Fr. As a result, the plasma distribution and the plasma density can be controlled for each cell.

Further, in accordance with the above embodiments, the plurality of cells C have the second resonance frequencies Fc as the cells C corresponding to the first resonance frequencies Fr of the plurality of resonators 101 forming the cell C. As a result, the output frequency Fo of the microwaves supplied to each cell C can be determined.

Further, in accordance with the above embodiments, the second resonance frequencies Fc of the plurality of cells C are different between adjacent cells C. As a result, the plasma interference between adjacent cells C can be suppressed.

Further, in accordance with the above embodiments, the plurality of cells C have different second resonance frequencies Fc. As a result, the plasma interference between adjacent cells C can be suppressed.

Further, in accordance with Modification 5, in the resonator array structure 100, at least three cells C having different second resonance frequencies Fc are arranged between the cells C having the same second resonance frequency Fc among the plurality of cells C. As a result, the number of second resonance frequencies Fc can be reduced, and the number of frequencies (the output frequencies Fo) of the microwaves for plasma excitation can be reduced.

Further, in accordance with Modifications 6 and 7, in the resonator array structures 100a and 100b, the plurality of cells C are arranged in one of multiple zones, and the plurality of cells C arranged in the same zone have the same second resonance frequency Fc. As a result, the number of second resonance frequencies Fc can be reduced, and the number of frequencies (the output frequencies Fo) of the microwaves for plasma excitation can be reduced.

Further, in accordance with Modification 6, the plurality of zones are arranged in a concentric quadrilateral shape. As a result, the number of second resonance frequencies Fc can be reduced, and the number of frequencies (the output frequencies Fo) of the microwaves for plasma excitation can be reduced.

Further, in according with Modification 7, the plurality of zones are arranged in a quadrant shape. As a result, the number of second resonance frequencies Fc can be reduced, and the number of frequencies (the output frequencies Fo) of the microwaves for plasma excitation can be reduced. Further, the plasma density can be independently controlled in each of the 12 o'clock, 3 o'clock, 6 o'clock, and 9 o'clock directions.

Further, in accordance with Modifications 6 and 7, the electromagnetic wave supply part is provided for each zone. As a result, the plasma density can be independently controlled for each zone.

Further, in accordance with Modifications 6 and 7, the second resonance frequency Fc is different for each zone. As a result, plasma density can be independently controlled for each zone.

Further, in accordance with the first embodiment, the electromagnetic wave supply part is provided for each cell C, and is configured to supply electromagnetic waves of a frequency capable of resonating with the resonator 101 forming the corresponding cell C. As a result, the plasma distribution and the plasma density can be controlled for each cell C.

Further, in accordance with Modifications 5 to 7, and the second and third embodiments, the electromagnetic wave supply part is configured to supply electromagnetic waves of a frequency capable of resonating with the resonator 101 forming the cell C to the plurality of cells C. As a result, the number of second resonance frequencies Fc can be reduced, and the number of frequencies (the output frequencies Fo) of the microwaves for plasma excitation can be reduced.

Further, in accordance with the third embodiment, the electromagnetic wave supply part is configured to supply electromagnetic waves including any one frequency capable of resonating with the second resonance frequency Fc corresponding to the plurality of cells C. As a result, plasma can be generated in a certain cell C.

Further, in accordance with the third embodiment, the electromagnetic wave supply part is configured to supply electromagnetic waves including a plurality of frequencies capable of resonating with the second resonance frequency Fc corresponding to each of the plurality of cells C to the plurality of cells C. As a result, the plasma distribution and the plasma density can be controlled in each of the cells C.

Further, in accordance with the first embodiment, and Modifications 2 and 3, the cell space CS of the cell C has a square shape, a regular triangular shape, or a regular hexagonal shape. As a result, the plasma distribution and the plasma density can be controlled for each cell.

Further, in accordance with Modifications 3, 4, 6, and 7, and the second embodiment, the plurality of cells C share the resonator 101 between adjacent cells C. As a result, the degree of integration of the cell C can be improved.

Further, in accordance with the above embodiments, the resonator 101 includes two or more C-shaped ring members 111B, and has a structure in which the dielectric plate 112B is embedded between the ring members 111B adjacent to each other in opposite directions. The first resonance frequency Fr is determined by the dimension of the ring member 111B and the thickness of the dielectric plate 112B. As a result, the first resonance frequency Fr of the resonator 101 can be set to be suitable for a target frequency band.

Further, in accordance with the third embodiment, in the plasma control method of the plasma processing apparatus 400, in the resonator array structure 100 configured to form the plurality of cells C surrounded by the plurality of resonators 101 capable of resonating with the magnetic field components of the electromagnetic waves for plasma excitation to be supplied to the processing space S, having a size smaller than the wavelength of electromagnetic waves, and having the first resonance frequency Fr, the electromagnetic wave supply part (the microwave output device 416) is controlled to supply electromagnetic waves including the plurality of frequencies capable of resonating with the plurality of second resonance frequencies Fc as the cells C corresponding to the plurality of first resonance frequencies Fr to the processing space S. As a result, even in the case of using one RF power supply 450 and cylindrical waveguide 431, the plasma distribution and the plasma density can be controlled for each cell C.

It should be noted that the embodiments of the present disclosure illustrative in all respects and are not restrictive. The above-described embodiments may be omitted, replaced, or changed in various forms without departing from the scope of the appended claims and the gist thereof.

In the above embodiments, the resonator array structures 100, 100a, 100b, and 300 are arranged along the bottom surface 20a of the dielectric window 20 or along the microwave transmission plate included in the antenna 240. However, the present disclosure is not limited thereto, and they may be spaced apart from the bottom surface 20a of the dielectric window 20 or the microwave transmission plate included in the antenna 240. Further, the resonator array structures 100, 100a, and 100b may be embedded in the dielectric window 20. Further, the resonator array structures 100, 100a, and 100b may be arranged along the upper surface of the electrostatic chuck 14c that faces the processing space S, or may be spaced apart from the upper surface of the electrostatic chuck 14c. Further, the resonator array structures 100, 100a, and 100b may be arranged along the inner wall surface of the sidewall 12a of the processing chamber 12, or may be spaced apart from the inner wall surface of the sidewall 12a of the processing chamber 12. For example, the resonator array structures 100, 100a, 100b may be arranged along one surface (first surface) of the member that faces the processing space S, or may be spaced apart from the first side of the member.

Further, in the first and third embodiments, the output parts of the microwave output devices 16 and 416 may be connected to the base 14a that is an RF electrode. In this case, the base 14a supplies microwaves outputted from the microwave output devices 16 and 416 to the processing space S via the electrostatic chuck 14c. In this configuration, the resonator array structures 100, 100a, and 100b may be embedded in the electrostatic chuck 14c.

Further, in the above embodiments, the microwaves have been described as the electromagnetic waves for plasma excitation to be supplied to the processing space S. However, the present disclosure is not limited thereto. For example, electromagnetic waves in very high frequency (VHF) to ultra high frequency (UHF) bands may be supplied as the electromagnetic waves for plasma generation to the processing space S.

Further, the present disclosure may employ the following configurations.

(1)

A plasma processing apparatus comprising:

a processing chamber having a processing space;

an electromagnetic wave generator configured to generate electromagnetic waves for plasma excitation to be supplied to the processing space;

a dielectric having a first surface facing the processing space;

an electromagnetic wave supply part configured to supply the electromagnetic waves to the processing space via the dielectric; and a resonator array structure disposed along the first surface of the dielectric in the processing chamber, wherein the resonator array structure includes a plurality of resonators, each resonator having a structure in which a conductive member is laminated on one surface of a dielectric plate, having a first resonance frequency, capable of resonating with magnetic field components of the electromagnetic waves and having a size smaller than a wavelength of the electromagnetic waves, and the resonator array structure is configured to form a plurality of cells surrounded by the resonators, and the plurality of cells include the resonators having different first resonance frequencies between the cells.

(2)

The plasma processing apparatus of (1), wherein each of the plurality of cells has a second resonance frequency of the cell corresponding to the first resonance frequencies of the resonators forming the cell.

(3)

The plasma processing apparatus of (2), wherein the plurality of cells have different second resonance frequencies between adjacent cells.

(4)

The plasma processing apparatus of (2) or (3), wherein the plurality of cells have different second resonance frequencies.

(5)

The plasma processing apparatus of (2) or (3), wherein the resonator array structure is disposed such that at least three cells having different second resonance frequencies are arranged between the cells having the same second resonance frequency among the plurality of cells.

(6)

The plasma processing apparatus of (2), wherein multiple cells in the resonator array structure are arranged in one of a plurality of zones, and the cells arranged in the same zone have the same second resonance frequency.

(7)

The plasma processing apparatus of (6), wherein the plurality of zones are provided in a concentric rectangular shape.

(8)

The plasma processing apparatus of (6), wherein the plurality of zones are provided in a quadrant shape.

(9)

The plasma processing apparatus of any one of (6) to (8), wherein the electromagnetic wave supply part is provided for each zone.

(10)

The plasma processing apparatus of any one of (6) to (9), wherein the second resonance frequency is different for each zone.

(11)

The plasma processing apparatus of any one of (1) to (10), wherein the electromagnetic wave supply part is provided for each cell, and each electromagnetic wave supply part is configured to supply the electromagnetic waves of a frequency resonating with the resonator forming the corresponding cell.

(12)

The plasma processing apparatus of any one of (1) to (10), wherein the electromagnetic wave supply part is configured to supply, for the plurality of cells, the electromagnetic waves of a frequency resonating with the resonators forming the cells.

(13)

The plasma processing apparatus of any one of (2) to (10), wherein the electromagnetic wave supply part is configured to supply, for the plurality of cells, the electromagnetic waves including any one frequency resonating with the second resonance frequency corresponding to each of the plurality of cells.

(14)

The plasma processing apparatus of any one of (2) to (10), wherein the electromagnetic wave supply part is configured to supply, for the plurality of cells, the electromagnetic waves including a plurality of frequencies resonating with the second resonance frequency corresponding to each of the plurality of cells.

(15)

The plasma processing apparatus of any one of (1) to (14), wherein a cell space of the cell has a square shape, a regular triangular shape, or a regular hexagonal shape.

(16)

The plasma processing apparatus of any one of (1) to (15), wherein the plurality of cells share the resonator between adjacent cells.

(17)

The plasma processing apparatus of any one of (1) to (16), wherein the member of the resonator includes two or more C-shaped ring members, and the resonator has a structure in which the dielectric plate is embedded between the ring members, which are arranged adjacent to each other in opposite directions, and the first resonance frequency is determined based on dimensions of the ring members and a thickness of the dielectric plate.

(18)

A plasma control method of a plasma processing apparatus, the method comprising:

for a resonator array structure configured to form a plurality of cells surrounded by a plurality of resonators, each resonator capable of resonating with magnetic field components of electromagnetic waves for plasma generation supplied to a processing space, having a size smaller than a wavelength of the electromagnetic waves, and having a first resonance frequency, controlling an electromagnetic wave supply part to supply, to the processing space, the electromagnetic waves including a plurality of frequencies that are capable of resonating with a plurality of second resonance frequencies of the cells corresponding to the first resonance frequencies.

The invention claimed is:

1. A plasma processing apparatus comprising:

a processing chamber having a processing space;

an electromagnetic wave generator configured to generate electromagnetic waves for plasma excitation to be supplied to the processing space;

a dielectric having a first surface facing the processing space;

an electromagnetic wave supply part configured to supply the electromagnetic waves to the processing space via the dielectric; and a resonator array structure disposed along the first surface of the dielectric in the processing chamber, wherein the resonator array structure includes a plurality of resonators, each resonator having a structure in which a conductive member is laminated on one surface of a dielectric plate, having a first resonance frequency, capable of resonating with magnetic field components of the electromagnetic waves and having a size smaller than a wavelength of the electromagnetic waves, and the resonator array structure is configured to form a plurality of cells surrounded by the resonators, and the plurality of cells include the resonators having different first resonance frequencies between the cells.

2. The plasma processing apparatus of claim 1, wherein each of the plurality of cells has a second resonance frequency of the cell corresponding to the first resonance frequencies of the resonators forming the cell.

3. The plasma processing apparatus of claim 2, wherein the plurality of cells have different second resonance frequencies between adjacent cells.

4. The plasma processing apparatus of claim 2, wherein the plurality of cells have different second resonance frequencies.

5. The plasma processing apparatus of claim 2, wherein the resonator array structure is disposed such that at least three cells having different second resonance frequencies are arranged between the cells having the same second resonance frequency among the plurality of cells.

6. The plasma processing apparatus of claim 2, wherein multiple cells in the resonator array structure are arranged in one of a plurality of zones, and the cells arranged in the same zone have the same second resonance frequency.

7. The plasma processing apparatus of claim 6, wherein the plurality of zones are provided in a concentric rectangular shape.

8. The plasma processing apparatus of claim 6, wherein the plurality of zones are provided in a quadrant shape.

9. The plasma processing apparatus of claim 6, wherein the electromagnetic wave supply part is provided for each zone.

10. The plasma processing apparatus of claim 6, wherein the second resonance frequency is different for each zone.

11. The plasma processing apparatus of claim 2, wherein the electromagnetic wave supply part is configured to supply, for the plurality of cells, the electromagnetic waves including any one frequency resonating with the second resonance frequency corresponding to each of the plurality of cells.

12. The plasma processing apparatus of claim 2, wherein the electromagnetic wave supply part is configured to supply, for the plurality of cells, the electromagnetic waves including a plurality of frequencies resonating with the second resonance frequency corresponding to each of the plurality of cells.

13. The plasma processing apparatus of claim 1, wherein the electromagnetic wave supply part is provided for each cell, and each electromagnetic wave supply part is configured to supply the electromagnetic waves of a frequency resonating with the resonator forming the corresponding cell.

14. The plasma processing apparatus of claim 1, wherein the electromagnetic wave supply part is configured to supply, for the plurality of cells, the electromagnetic waves of a frequency resonating with the resonators forming the cells.

15. The plasma processing apparatus of claim 1, wherein a cell space of the cell has a square shape, a regular triangular shape, or a regular hexagonal shape.

16. The plasma processing apparatus of claim 1, wherein the plurality of cells share the resonator between adjacent cells.

17. The plasma processing apparatus of claim 1, wherein the member of the resonator includes two or more C-shaped ring members, and the resonator has a structure in which the dielectric plate is embedded between the ring members, which are arranged adjacent to each other in opposite directions, and the first resonance frequency is determined based on dimensions of the ring members and a thickness of the dielectric plate.

18. A plasma control method of a plasma processing apparatus, the method comprising:

for a resonator array structure configured to form a plurality of cells surrounded by a plurality of resonators, each resonator capable of resonating with magnetic field components of electromagnetic waves for plasma generation supplied to a processing space, having a size smaller than a wavelength of the electromagnetic waves, and having a first resonance frequency, controlling an electromagnetic wave supply part to supply, to the processing space, the electromagnetic waves including a plurality of frequencies that are capable of resonating with a plurality of second resonance frequencies of the cells corresponding to the first resonance frequencies.

* * * * *